US011336022B2

(12) United States Patent
Kim et al.

(10) Patent No.: US 11,336,022 B2
(45) Date of Patent: May 17, 2022

(54) ANTENNA APPARATUS

(71) Applicant: Samsung Electro-Mechanics Co., Ltd., Suwon-si (KR)

(72) Inventors: Nam Ki Kim, Suwon-si (KR); Dae Ki Lim, Suwon-si (KR); Jeong Ki Ryoo, Suwon-si (KR); Ju Hyoung Park, Suwon-si (KR); Jae Min Keum, Suwon-si (KR); Myeong Woo Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 34 days.

(21) Appl. No.: 17/082,343

(22) Filed: Oct. 28, 2020

(65) Prior Publication Data

US 2021/0050670 A1   Feb. 18, 2021

Related U.S. Application Data

(63) Continuation of application No. 16/297,893, filed on Mar. 11, 2019, now Pat. No. 10,854,986.

(30) Foreign Application Priority Data

Jul. 18, 2018  (KR) .................. 10-2018-0083703
Oct. 22, 2018  (KR) .................. 10-2018-0126090

(51) Int. Cl.
*H01Q 21/00*  (2006.01)
*H01Q 1/50*   (2006.01)
(Continued)

(52) U.S. Cl.
CPC ......... *H01Q 15/006* (2013.01); *H01Q 1/2283* (2013.01); *H01Q 1/521* (2013.01);
(Continued)

(58) Field of Classification Search
CPC .... H01Q 15/006; H01Q 21/065; H01Q 1/521; H01Q 9/0407; H01Q 1/2283;
(Continued)

(56) References Cited

U.S. PATENT DOCUMENTS 7,592,957 B2   9/2009   Achour et al.
7,764,232 B2   7/2010   Achour et al.
(Continued)

FOREIGN PATENT DOCUMENTS

JP   2007-243375 A   9/2007
JP   2008-283381 A   11/2008
(Continued)

OTHER PUBLICATIONS

Korean Office Action dated May 20, 2019 in counterpart Korean Patent Application No. 10-2018-0126090 (4 pages in English and 4 pages in Korean).
(Continued)

*Primary Examiner* — Vibol Tan
(74) *Attorney, Agent, or Firm* — NSIP Law

(57) ABSTRACT

An antenna apparatus includes a ground layer, patch antenna patterns, feed vias, ring-type meta patterns, and coupling-type meta patterns. The ground layer has one or more through-holes. Patch antenna patterns are each disposed above the ground layer. Feed vias are disposed to penetrate through the one or more through-holes, and electrically connect to the patch antenna patterns, respectively. Ring-type meta patterns are arranged between the patch antenna patterns. Coupling-type meta patterns are alternately arranged between the patch antenna patterns in fewer numbers than the ring-type meta patterns in positions more distant from the patch antenna patterns than positions in which the ring-type meta patterns are arranged.

20 Claims, 22 Drawing Sheets

(51) Int. Cl.
  *H01Q 15/00* (2006.01)
  *H01Q 21/06* (2006.01)
  *H01Q 1/52* (2006.01)
  *H01Q 9/04* (2006.01)
  *H01Q 1/22* (2006.01)

(52) U.S. Cl.
  CPC .......... *H01Q 1/523* (2013.01); *H01Q 9/0407* (2013.01); *H01Q 21/00* (2013.01); *H01Q 21/0018* (2013.01); *H01Q 21/061* (2013.01); *H01Q 21/065* (2013.01)

(58) Field of Classification Search
  CPC ...... H01Q 1/523; H01Q 19/108; H01Q 5/385; H01Q 21/30; H01Q 21/28; H01Q 19/28; H01Q 1/241; H01Q 1/242; H01Q 1/243; H01Q 1/24
  See application file for complete search history.

(56) References Cited

U.S. PATENT DOCUMENTS

| | | | | |
|---|---|---|---|---|
| 7,855,689 | B2* | 12/2010 | Fukui | H01Q 15/008 |
| | | | | 343/731 |
| 7,855,696 | B2* | 12/2010 | Gummalla | H01Q 25/00 |
| | | | | 343/876 |
| 7,982,673 | B2* | 7/2011 | Orton | H01Q 15/006 |
| | | | | 343/700 MS |
| 9,190,735 | B2 | 11/2015 | Xu et al. | |
| 9,748,663 | B2 | 8/2017 | Wong | |
| 10,804,227 | B2* | 10/2020 | Kamgaing | H01L 23/49827 |
| 10,826,172 | B2* | 11/2020 | Kim | H01Q 1/48 |
| 10,833,414 | B2* | 11/2020 | Kim | H01Q 9/045 |
| 10,886,618 | B2* | 1/2021 | Kim | H01Q 19/24 |
| 10,978,780 | B2* | 4/2021 | Ryoo | H01Q 1/2283 |
| 10,978,796 | B2* | 4/2021 | Kim | H01L 23/5385 |
| 11,024,972 | B2* | 6/2021 | Jang | H01Q 1/2291 |
| 11,128,030 | B2* | 9/2021 | Kim | H05K 1/148 |
| 2008/0048917 | A1 | 2/2008 | Achour et al. | |
| 2010/0060527 | A1 | 3/2010 | Kim et al. | |
| 2016/0028161 | A1 | 1/2016 | Kawaguchi et al. | |
| 2017/0244174 | A1 | 8/2017 | Kawaguchi et al. | |
| 2018/0123222 | A1 | 5/2018 | Jang et al. | |
| 2019/0115671 | A1 | 4/2019 | Yoon et al. | |
| 2019/0229398 | A1 | 7/2019 | Ryoo et al. | |
| 2020/0106188 | A1 | 4/2020 | Ou et al. | |

FOREIGN PATENT DOCUMENTS

| | | |
|---|---|---|
| JP | 2014-527366 A | 10/2014 |
| JP | 6262617 B2 | 1/2018 |
| KR | 10-2010-0030568 A | 3/2010 |
| WO | WO 2013/027029 A1 | 2/2013 |

OTHER PUBLICATIONS

Korean Notice of Allowance dated Jul. 31, 2021 in counterpart Korean Patent Application 10-2020-0009677 (2 pages in English and 2 pages in Korean).

* cited by examiner

ANTENNA APPARATUS

CROSS-REFERENCE TO RELATED APPLICATIONS

This application is a continuation of application Ser. No. 16/297,893 filed on Mar. 11, 2019, which claims the benefit under 35 USC 119(a) of Korean Patent Application Nos. 10-2018-0083703 filed on Jul. 18, 2018 and 10-2018-0126090 filed on Oct. 22, 2018 in the Korean Intellectual Property Office, the entire disclosure of which is incorporated herein by reference for all purposes.

BACKGROUND

1. Field

The following description relates to an antenna apparatus.

2. Description of Related Art

Data traffic for mobile communications tends to increase every year rapidly. Technology has been actively developed to support such demand in a real-time data wireless network. For example, applications such as a content creation of Internet of Things (IoT) based data, augmented reality (AR), virtual reality (VR), live VR/AR combined with social network service (SNS), autonomous driving, sync view, which views real time image transmission using an ultrasmall camera, and the like, require a communication topology (for example, $5^{th}$ generation (5G) communications, millimeter wave (mmWave) communications, and the like) that can support the transmission and reception of large amounts of data.

Therefore, research into the mmWave communications including the 5G communications has been conducted, and research into the commercialization/standardization of an antenna apparatus that is capable of smoothly implementing mmWave communications has been conducted.

A radio frequency (RF) signal in a high-frequency band (for example, 24 GHz, 28 GHz, 36 GHz, 39 GHz, 60 GHz, or the like) may be easily absorbed and lost in a transfer process thereof, and communications quality may thus become deteriorated. Therefore, an antenna for communications in the high frequency band requires a technical approach different from that of existing antenna technology, and may require the development of special technology such as a separate power amplifier, or the like, for securing antenna gain, integration between an antenna and a radio frequency integrated circuit (RFIC), securing of effective isotropic radiated power (EIRP), and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an antenna apparatus includes a ground layer, patch antenna patterns, feed vias, ring-type meta patterns, and coupling-type meta patterns. The ground layer has one or more through-holes. Patch antenna patterns are each disposed above the ground layer. Feed vias are disposed to penetrate through the one or more through-holes, and electrically connect to the patch antenna patterns, respectively. Ring-type meta patterns are duplicatively arranged between the patch antenna patterns. Coupling-type meta patterns are duplicatively arranged between the patch antenna patterns in fewer numbers than the ring-type meta patterns in positions more distant from the patch antenna patterns than positions in which the ring-type meta patterns are arranged.

The ring-type meta patterns may be arranged to have spaces therebetween, the spaces have a first gap, and the coupling-type meta patterns may be arranged to form cavities each having a width wider than the spaces between the ring-type meta patterns.

Each of the cavities may have an area smaller than an area of each of the coupling-type meta patterns.

The coupling-type meta patterns may be arranged to have spaces therebetween, the spaces having substantially the same gap as the first gap.

The cavity may have a polygonal shape in which a length in a first direction and a length in a second direction perpendicular to the first direction are different from each other.

Each of the coupling-type meta patterns may have a polygonal shape in which a length in the first direction is greater than a length in the second direction, and the cavity may have a polygonal shape in which the length in the second direction is greater than the length in the first direction.

The coupling-type meta patterns may be arranged in N zigzag rows, wherein N is a natural number.

The coupling-type meta patterns may have a form in which portions of coupling-type meta patterns closer to one of the patch antenna patterns and portions of coupling-type meta patterns closer to the other one of the patch antenna patterns are alternately inserted with respect to each other.

The ring-type meta patterns may be arranged to have spaces therebetween, the spaces having a first gap. One side of sides of the coupling-type meta patterns may be disposed to be spaced apart from the ring-type meta patterns by the first gap. Another side of other sides of the coupling-type meta patterns may be disposed to be spaced apart from the ring-type meta patterns by a second gap greater than the first gap.

The ring-type meta patterns may be arranged in N rows.

The ring-type meta patterns may be overlappingly arranged with each other in a vertical direction, and the coupling-type meta patterns may be overlappingly arranged with each other in the vertical direction.

The antenna apparatus may further include array vias connecting only the ring-type meta patterns to each other in the vertical direction.

The antenna apparatus may further include coupling patch patterns disposed above the patch antenna patterns. Some of the ring-type meta patterns and some of the coupling-type meta patterns may be disposed on a same level as a level on which the coupling patch patterns are disposed. Others of the ring-type meta patterns and others of the coupling-type meta patterns may be disposed on a same level as a level on which the patch antenna patterns are disposed.

The patch antenna patterns may be arranged in a first direction, and one of the coupling-type meta patterns arranged at a corner in a second direction perpendicular to the first direction among the coupling-type meta patterns may have an area greater than an area of another one of the coupling-type meta patterns arranged at a center in the second direction.

The ring-type meta patterns may be arranged to surround each of the patch antenna patterns, and the coupling-type meta patterns may be arranged to surround the ring-type meta patterns.

The antenna apparatus may further include end-fire antenna patterns disposed to be spaced apart from each of the patch antenna patterns in a second direction when viewed in a vertical direction. The patch antenna patterns may be arranged in a first direction perpendicular to the second direction. Some of the ring-type meta patterns and some of the coupling-type meta patterns may be arranged between the end-fire antenna patterns and the patch antenna patterns when viewed in the vertical direction.

The antenna apparatus may further include an integrated circuit (IC) disposed below the ground layer, feed lines disposed between the ground layer and the IC, and wiring vias electrically connecting the IC and the feed lines to each other. Some of the feed lines may be electrically connected to the feed vias, and others of the feed lines may be electrically connected to the end-fire antenna patterns.

In another general aspect, an antenna apparatus includes a ground layer having at least one through-hole, a patch antenna pattern disposed above the ground layer, a feed via disposed to penetrate through the at least one through-hole and electrically connected to the patch antenna pattern, ring-type meta patterns, and coupling-type meta patterns. The ring-type meta patterns are arranged to surround at least portions of side boundaries of the patch antenna pattern and have spaces therebetween, the spaces having a first gap. The coupling-type meta patterns are arranged to surround at least portions of the side boundaries of the patch antenna pattern in positions more distant from the patch antenna pattern than positions in which the ring-type meta patterns are arranged and arranged to form cavities having a second gap therebetween, the second gap being greater than the first gap.

The coupling-type meta patterns may be arranged in zigzag rows, and the cavities may be formed by side boundaries of the ring-type meta patterns and flexion of the zigzag rows.

Each of the coupling-type meta patterns may have a polygonal shape in which a length in a first direction is greater than a length in a second direction perpendicular to the first direction. One of the cavities may have a polygonal shape in which a length in the second direction is greater than a length in the first direction.

Each of the cavities may have an area smaller than that of each of the coupling-type meta patterns.

The coupling-type meta patterns may be arranged to have spaces therebetween, the spaces having substantially the same gap as the first gap.

The coupling-type meta patterns may surround the patch antenna pattern so as to form a polygon. A coupling-type meta pattern corresponding to a corner of the polygon among the coupling-type meta patterns may have an area greater than an area of a coupling-type meta pattern corresponding to a side of the polygon among the coupling-type meta patterns.

The antenna apparatus may further include array vias arranged to surround at least portions of the side boundaries of the patch antenna pattern. The ring-type meta patterns may be arranged to electrically connect to each other by the array vias.

The coupling-type meta patterns may be overlappingly arranged with each other in a vertical direction and are electrically disconnected from each other.

In another general aspect, an antenna apparatus includes a ground layer, patch antenna patterns, feed vias, ring-type meta patterns, coupling-type meta patterns, and array vias. The ground layer has one or more through-holes. Patch antenna patterns are each disposed above the ground layer. Feed vias are disposed to penetrate through the one or more through-holes, and electrically connected to the patch antenna patterns, respectively. Ring-type meta patterns are duplicatively arranged in a horizontal direction and a vertical direction between the patch antenna patterns. Coupling-type meta patterns are duplicatively arranged in the horizontal direction and the vertical direction between the patch antenna patterns and arranged in positions more distant from the patch antenna patterns than positions in which the ring-type meta patterns are arranged. Array vias connect the ring-type meta patterns to each other in the vertical direction. The coupling-type meta patterns are disconnected from each other in the horizontal direction and the vertical direction.

The coupling-type meta patterns may have a form in which portions of coupling-type meta patterns closer to one of the patch antenna patterns and portions of coupling-type meta patterns closer to the other one of the patch antenna patterns are alternately inserted with respect to each other.

Each of the coupling-type meta patterns may be greater than each of the ring-type meta patterns.

The ring-type meta patterns may be arranged to have spaces therebetween, the spaces having a first gap. The coupling-type meta patterns may be arranged to have spaces therebetween, the spaces having substantially the same gap as the first gap.

One side of sides of the coupling-type meta patterns may be disposed to be spaced apart from the ring-type meta patterns by the first gap, and other sides of the sides of the coupling-type meta patterns may be disposed to be spaced apart from the ring-type meta patterns by a second gap greater than the first gap.

The second gap may be smaller than a distance between the ring-type meta patterns and the patch antenna patterns.

The coupling-type meta patterns and the ring-type meta patterns may be arranged to form cavities therebetween, and the cavities may be arranged in a mosaic structure with respect to the coupling-type meta patterns.

In another general aspect, an antenna apparatus includes a ground layer, patch antenna patterns disposed on the ground layer, feed vias, first-type meta patterns, and second-type meta patterns. The feed vias are disposed to electrically connect the patch antenna patterns, respectively. The first-type meta patterns are peripherally disposed around each of the patch antenna patterns. The second-type meta patterns are disposed to form a checkered pattern between the first-type meta patterns of adjacent ones of the patch antenna patterns.

The first-type meta patterns may be ring-type meta patterns, and the second-type meta patterns may be coupling-type meta patterns.

Each of the second-type meta patterns may be spaced apart from each other, and each of the first-type meta patterns may be spaced apart from each other.

Alternate ones of the second-type meta patterns may be disposed inline, and other ones of the alternate ones of the second-type meta patterns may be disposed to be staggered from the alternate ones.

Alternate ones of the second-type meta patterns may overlap other ones of the alternate ones of the second-type meta patterns, respectively.

End ones of the second-type meta patterns may each have an area larger than an area of each intermediate ones of the second-type meta patterns.

Opposing columns of the second-type meta patterns may be spaced apart from each other to define an extended gap having a width greater than a width between each of the first-type meta patterns.

The checkered pattern may be formed with the second-type meta patterns to form cavities adjacent each of the second-type meta patterns.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
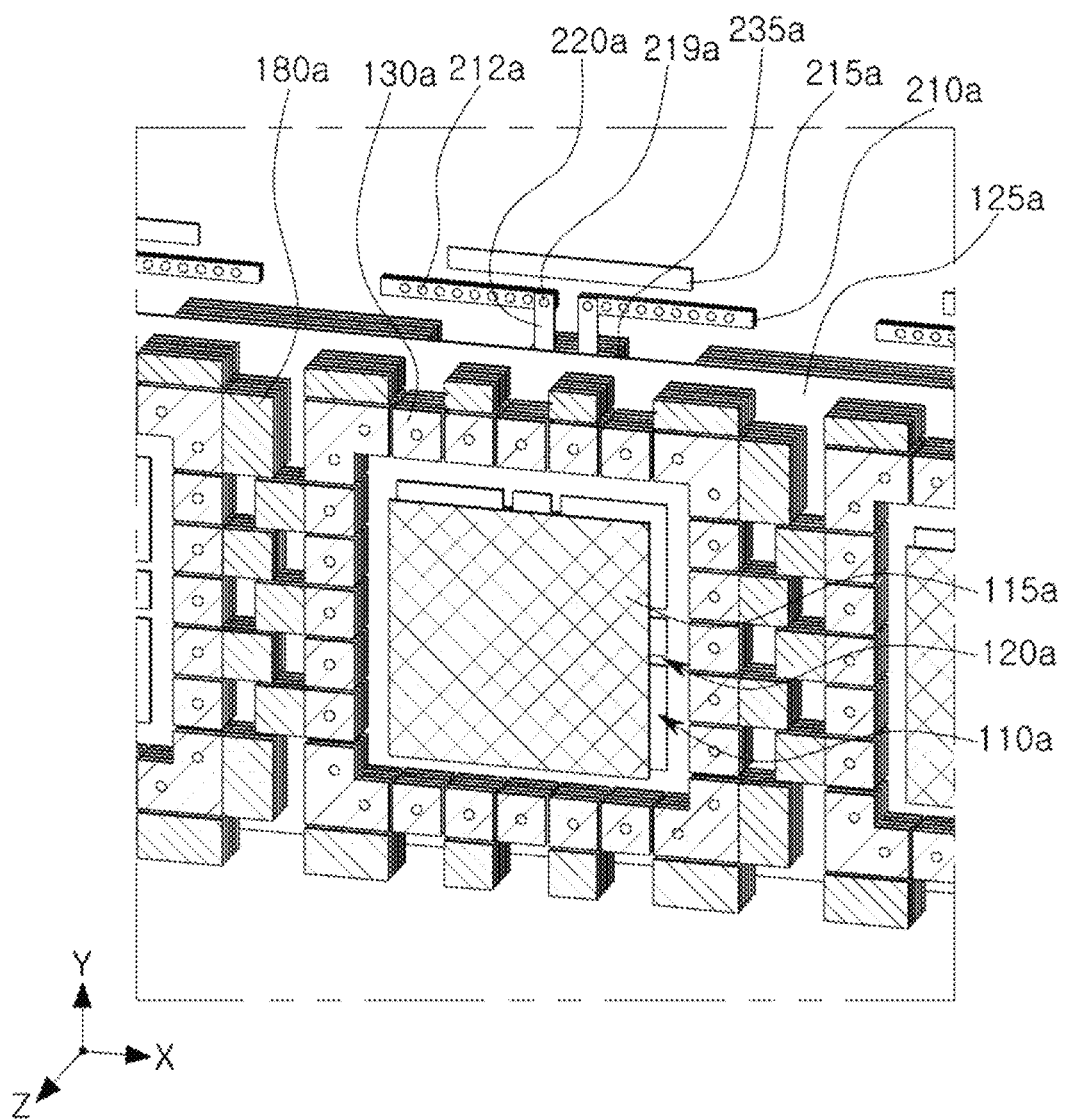
FIG. 1 is a perspective view illustrating an example of an antenna apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a perspective view illustrating an example of an antenna apparatus.

Referring to FIG. 1, an antenna apparatus in the present disclosure may include a patch antenna pattern 110a, feed vias 120a, ring-type meta patterns 130a, and coupling-type meta patterns 180a.

The feed vias 120a may be configured so that radio frequency (RF) signals pass therethrough. For example, the feed vias 120a may electrically connect an integrated circuit (IC) and the patch antenna pattern 110a to each other, and may have a structure in which they extend in a z-direction.

The patch antenna pattern 110a may be electrically connected to one end of each of the feed vias 120a. The patch antenna pattern 110a may receive RF signals from the feed vias 120a, transmit the RF signals in the z-direction, and transfer RF signals received in the z-direction to the feed vias 120a.

Some of the RF signals propagated through the patch antenna pattern 110a may propagate toward a ground layer 125a disposed below the patch antenna pattern 110a. The RF signals propagated toward the ground layer 125a may be reflected from the ground layer 125a and then propagated in the z-direction. Therefore, the RF signals propagated through the patch antenna pattern 110a may be further concentrated in the z-direction.

For example, the patch antenna pattern 110a may have a structure of a patch antenna having opposing circular shaped or polygonal shaped surfaces. The opposing surfaces of the patch antenna pattern 110a may serve as a boundary between a conductor and a non-conductor through which the RF signals are propagated. The patch antenna pattern 110a may have an inherent frequency band (for example, 28 GHz) depending on its parameters (for example, a shape, a size, a height, a dielectric constant of an insulating layer, and the like).

Ring-type meta patterns 130a may be disposed to be spaced apart from the patch antenna pattern 110a, and be arranged to correspond to at least portions of side boundaries of the patch antenna pattern 110a. The ring-type meta patterns 130a may be electromagnetically coupled to the patch antenna pattern 110a, and may guide a path for the RF signals of the patch antenna pattern 110a in the z-direction.

For example, the ring-type meta patterns 130a may have the same shape, and may be repeatedly or duplicatively arranged. That is, the ring-type meta patterns 130a may be configured to have electromagnetic bandgap characteristics, and may have a negative refractive index with respect to the RF signals. Therefore, the ring-type meta patterns 130a may further guide the path of the RF signals of the patch antenna pattern 110a in the z-direction.

In addition, the ring-type meta patterns 130a may be electromagnetically coupled to the patch antenna pattern 110a, and parameters (for example, a height, a shape, and a size of each of the ring-type meta patterns, the number of ring-type meta patterns, a gap between the ring-type meta patterns, a distance between the ring-type meta patterns and the patch antenna pattern, and the like) of the ring-type meta patterns 130a may have an influence on frequency characteristics of the patch antenna pattern 110a.

Most of the RF signals propagated through the ring-type meta patterns 130a can be guided close to the z-direction, but some of the RF signals can become distant from the z-direction. Therefore, some of the RF signals propagated through the ring-type meta patterns 130a may leak in an x-direction and/or a y-direction in the ring-type meta patterns 130a.

Coupling-type meta patterns 180a may be arranged to correspond to at least portions of side boundaries of the ring-type meta patterns 130a, and may be arranged to be sparser, or in fewer numbers, than the ring-type meta patterns 130a.

For example, the coupling-type meta patterns 180a may have the same shape, and may be duplicatively or alternately arranged. That is, the coupling-type meta patterns 180a may be configured to have electromagnetic bandgap characteristics, and may have a negative refractive index with respect to the RF signals. Therefore, the coupling-type meta patterns 180a may further guide the path of the RF signals of the patch antenna pattern 110a in the z-direction.

In addition, the coupling-type meta patterns 180a may be configured to be easily coupled to coupling-type meta patterns of an adjacent antenna apparatus. For example, the coupling-type meta patterns 180a may provide spaces into which corresponding portions of the coupling-type meta patterns of an adjacent antenna apparatus may be inserted and disposed.

Therefore, the coupling-type meta patterns 180a may be coupled to the coupling-type meta patterns of an adjacent antenna apparatus to similarly act as the ring-type meta patterns 130a. That is, since the coupling-type meta patterns 180a may be efficiently linked to the ring-type meta patterns 130a, the antenna apparatus may be operated as if a width of each of the ring-type meta patterns 130a in a horizontal direction (x-direction/y-direction) is increased. Increasing the width of each of the ring-type meta patterns 130a in a horizontal direction results in a wider coverage of the path through which the RF signals reflected from the ground layer 125a may propagate. Therefore, in the antenna apparatus in the present disclosure, the path that the RF signals propagate may be further guided in the z-direction.

Here, increasing the width of each of meta patterns (including ring-type meta patterns and coupling-type meta patterns) in the horizontal direction results in a greater amount space being used by the meta patterns. Therefore, there may be a trade-off between an RF signal coverage of the meta patterns and the space used by the meta patterns.

The antenna apparatus in the present disclosure may include meta patterns of which an increase in the RF signal coverage is greater than that in a size. For example, the antenna apparatus in the present disclosure may have an RF signal coverage of which a width in the horizontal direction is increased about twice using the meta patterns of which a width of each in the horizontal direction is increased about 1.5 times.

Here, the fact that the width of each of the meta patterns in the horizontal direction is increased about 1.5 times may be due to the fact that the coupling-type meta patterns 180a and the coupling-type meta patterns of the adjacent antenna apparatus share a disposition space with each other. That is, since the adjacent antenna apparatus may also be operated as if a width of each of the ring-type meta patterns thereof in the horizontal direction is increased due to the coupling between the coupling-type meta patterns 180a and the coupling-type meta patterns of the adjacent antenna apparatus, two antenna apparatuses may share the disposition space of the coupling-type meta patterns with each other.

Therefore, the antenna apparatus in the present disclosure may have a gain improved as compared to a size in terms of a single antenna apparatus.

In addition, portions of spaces between the coupling-type meta patterns 180a may be filled with portions of the coupling-type meta patterns of an adjacent antenna apparatus. Therefore, the other portions of the spaces between the coupling-type meta patterns 180a may form cavities. Each of the cavities may have upper and lower surfaces each having an area smaller than that of each of the coupling-type meta patterns 180a.

The cavities may reduce electromagnetic interference between the antenna apparatus and an adjacent antenna apparatus. That is, the cavities may act as barriers to prevent the meta patterns from guiding the RF signals in the x-direction and/or the y-direction while guiding the RF signals in the z-direction.

For example, when the antenna apparatus transmits and receives horizontal pole (H pole) RF signals and vertical pole (V pole) RF signals to implement polarization, the H pole RF signals of the antenna apparatus may cause electromagnetic interference with an adjacent antenna apparatus. The cavities may prevent the H pole RF signals from being propagated to an adjacent antenna apparatus through meta patterns.

Therefore, the antenna apparatus in the present disclosure may have an improved gain relative to its size in terms of an array of antenna apparatuses.

Still, the antenna apparatus in the present disclosure may have characteristics dependent on sizes of the cavities. Therefore, the cavities may act as parameters for adjusting antenna characteristics.

Referring to FIG. 1, the antenna apparatus in the present disclosure may further include a coupling patch pattern 115a disposed above the patch antenna pattern 110a and disposed to be at least partially surrounded by the ring-type meta patterns 130a when viewed in a vertical direction (the z-direction). Therefore, the antenna apparatus in the present disclosure may have a wider bandwidth.

An optimal position for connecting the feed via 120a in the patch antenna pattern 110a may become close to the boundary of the patch antenna pattern 110a depending on how the coupling patch pattern 115a is disposed. When the optimal position is close to an edge of the patch antenna pattern 110a in a first direction (for example, a direction of 0°) of the patch antenna pattern 110a, a surface current flowing in the patch antenna pattern 110a, depending on the RF signal transmission and reception of the patch antenna pattern 110a, may flow toward a third direction (for example, a direction of 180°) of the patch antenna pattern 110a. In this example, the surface current may be dispersed in a second direction (for example, a direction of 90°) and a fourth direction (for example, a direction of 270°), and the ring-type meta patterns 130a and/or coupling-type meta patterns 180a may guide RF signals leaked in lateral directions due to the dispersion of the surface current in the second and fourth directions in an upward direction. Therefore, radiation patterns of the patch antenna pattern 110a may be further concentrated in the upward direction, and antenna performance of the patch antenna pattern 110a may thus be improved. However, the coupling patch pattern 115a may be omitted based on design intent.

Referring to FIG. 1, the antenna apparatus in the present disclosure may further include at least some of end-fire antenna patterns 210a, director patterns 215a, feed lines 220a, and coupling ground patterns 235a.

The end-fire antenna patterns 210a may form radiation patterns in a second direction (for example, the y-direction) to transmit or receive the RF signals in the second direction (for example, the y-direction). Therefore, the antenna apparatus in the present disclosure may omni-directionally transmit and receive the RF signals.

For example, the end-fire antenna patterns 210a may have a dipole form or a folded dipole form. In this example, one end of a pole of each of the end-fire antenna patterns 210a may be electrically connected to the feed line 220a. A frequency band of the end-fire antenna pattern 210a may be designed to be substantially the same as that of the patch antenna pattern 110a, but is not limited thereto.

In addition, the end-fire antenna pattern 210a may have a structure in which horizontal patterns and coupling vias 212a are coupled to each other. Therefore, the end-fire antenna pattern 210a may have an electromagnetic plane directed toward the second direction (for example, the y-direction) and having a surface current flowing thereon, and thus, have an improved gain.

The director pattern 215a may be electromagnetically coupled to the end-fire antenna pattern 210a to improve the gain or bandwidth of the end-fire antenna pattern 210a. For example, the director pattern 215a may use a fewer number of layers (for example, one layer) than the number of layers of the end-fire antenna pattern 210a resulting in the end-fire antenna pattern 210a that may have a wider bandwidth.

The feed lines 220a may transfer the RF signals received from the end-fire antenna patterns 210a to the IC, and may transfer RF signals received from the IC to the end-fire antenna patterns 210a. For example, the feed lines 220a may be electrically connected to the end-fire antenna patterns 210a through second feed vias 219a.

The coupling-type meta patterns 180a may improve electromagnetic isolation between the patch antenna pattern 110a and the end-fire antenna patterns 210a, which results in antenna performance improvements and miniaturization of the antenna apparatus in the present disclosure.

The coupling ground patterns 235a may be disposed above or below the feed lines 220a. The coupling ground patterns 235a may be electromagnetically coupled to the end-fire antenna patterns 210a resulting in the end-fire antenna pattern 210a having a wider bandwidth.

Figure 2A:
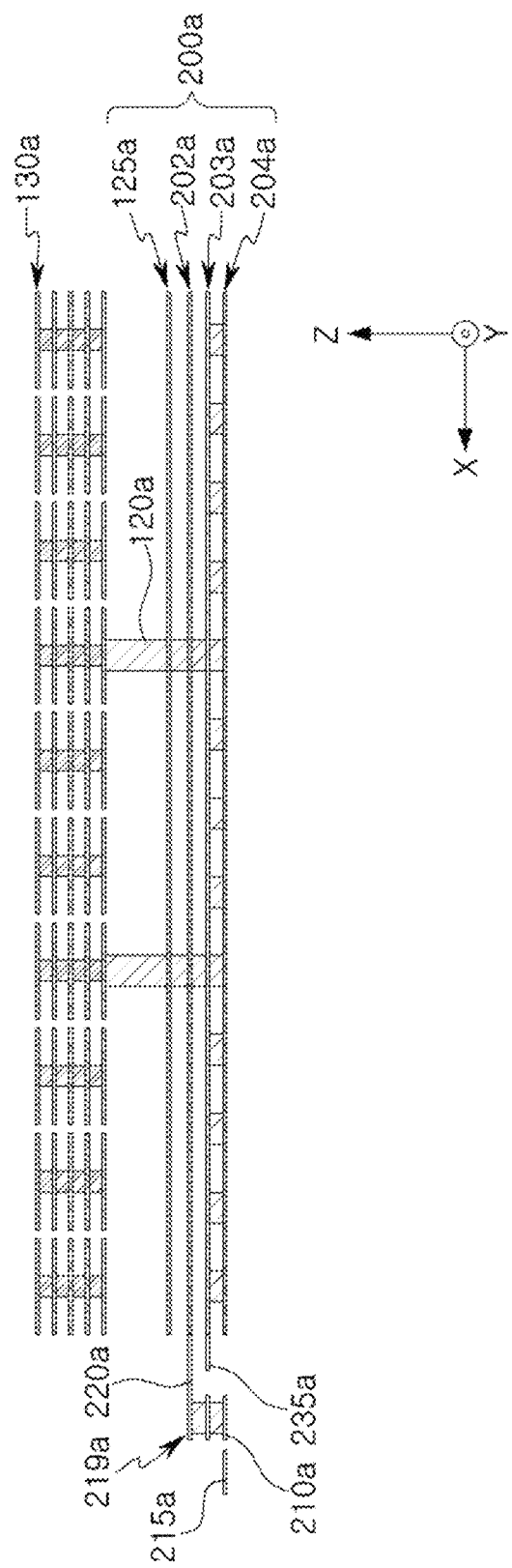
FIG. 2A is a cross-sectional view illustrating an example of the antenna apparatus.
Figure 2B:
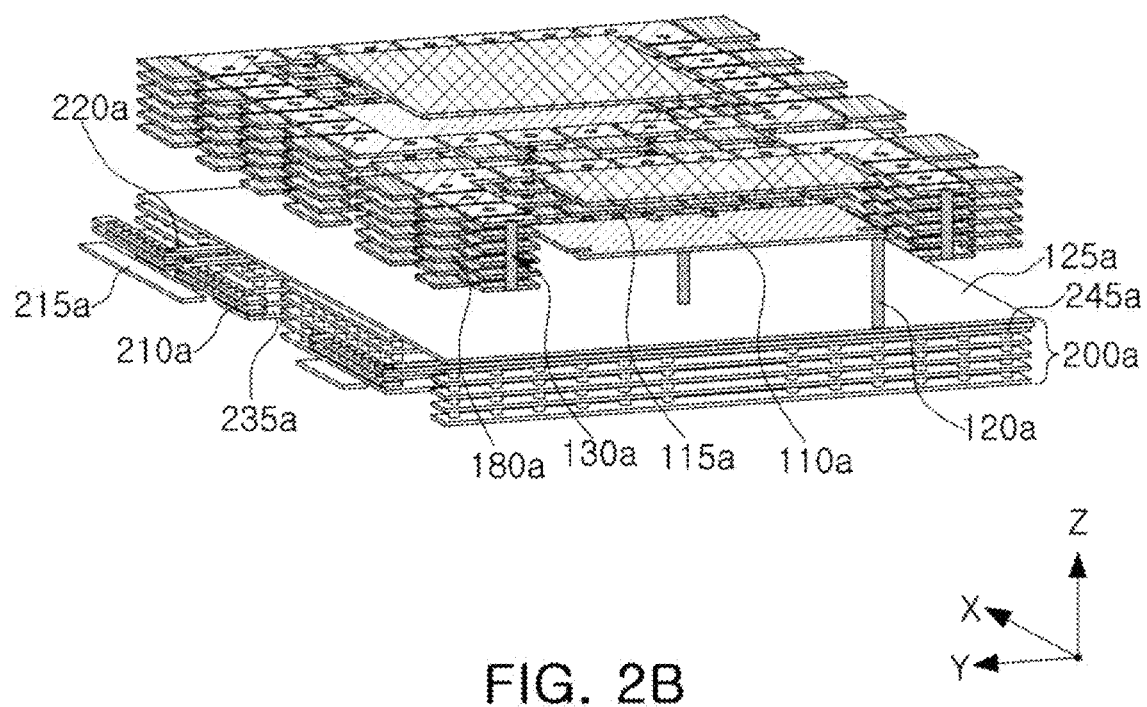
FIG. 2B is a perspective view illustrating an example of a cross-section of the antenna apparatus.

FIG. 2A is a cross-sectional view illustrating an example of the antenna apparatus illustrated in FIG. 1. FIG. 2B is a perspective view illustrating an example of a cross-section of the antenna apparatus illustrated in FIG. 2A.

Referring to FIGS. 2A and 2B, the patch antenna pattern and the coupling patch patterns may be disposed on the same layers as layers on which the ring-type meta patterns 130a and coupling-type meta patterns 180a are disposed, respectively. Therefore, the ring-type meta patterns 130a and coupling-type meta patterns 180a may efficiently guide the RF signals leaked from the patch antenna pattern in an upward direction.

Each of the ring-type meta patterns 130a and the coupling-type meta patterns 180a may have (for example, six) layers. As the number of layers of each the ring-type meta patterns 130a and the coupling-type meta patterns 180a is increased, RF signal guiding performance of the ring-type meta patterns 130a and RF signal reflecting performance of the coupling-type meta patterns 180a may be improved.

Meanwhile, a connection member 200a may include the ground layer 125a described above, and may further include a wiring ground layer 202a, a second ground layer 203a, and an IC ground layer 204a. The feed line 220a may be disposed on the same level as a level on which the wiring ground layer 202a is disposed.

Referring to FIG. 2B, the ring-type meta patterns 130a may be arranged in a row. A gap between the ring-type meta patterns 130a may be smaller than that between corresponding ring-type meta patterns 130a and coupling-type meta patterns 180a, resulting in the ring-type meta patterns 130a that may further efficiently guide the RF signals in the z-direction.

Meanwhile, referring to FIG. 2B, the connection member 200a may include shielding vias 245a electrically connecting ground layers to each other and disposed adjacent to edges of the ground layers.

Some of the shielding vias 245a may be arranged below the ring-type meta patterns 130a, and the others of the shielding vias 245a may be arranged to surround the feed vias 120a, resulting in reduced electromagnetic noise on the feed vias 120a and reduced transmission loss of the RF signals.

Figure 2C:
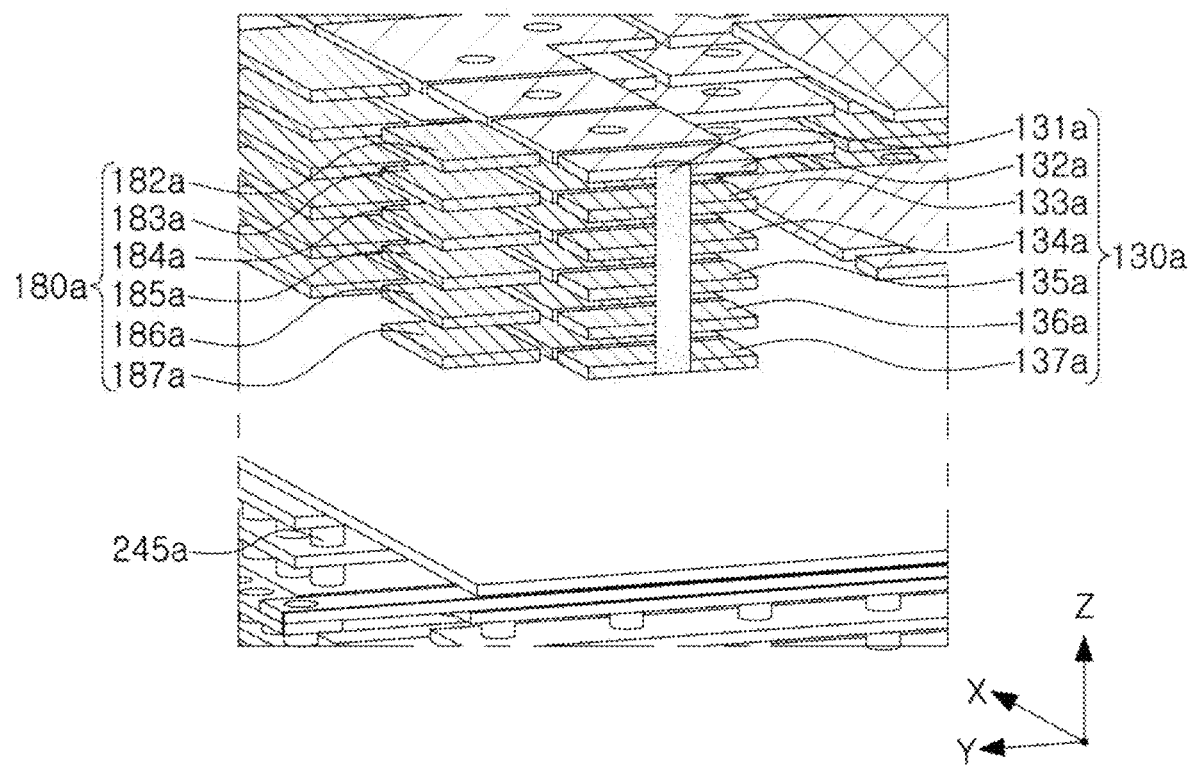
FIG. 2C is a perspective view illustrating an example of ring-type meta-patterns and coupling-type meta-patterns of the antenna apparatus.

FIG. 2C is a perspective view illustrating examples of ring-type meta patterns and coupling-type meta patterns of the antenna apparatus in the present disclosure in further detail.

Referring to FIG. 2C, the ring-type meta pattern 130a may include first ring-type meta patterns 137a, second ring-type meta patterns 132a, third ring-type meta patterns 133a, fourth ring-type meta patterns 134a, fifth ring-type meta patterns 135a, and sixth ring-type meta patterns 136a. The first, second, third, fourth, fifth, and sixth ring-type meta patterns 137a, 132a, 133a, 134a, 135a, and 136a may be electrically connected to each other by array vias 131a. Therefore, the ring-type meta patterns 130a may have characteristics closer to electromagnetic bandgap characteristics.

Depending on a design, the array vias 131a may connect only the ring-type meta patterns 130a of the ring-type meta patterns 130a and the coupling-type meta patterns 180a to each other in the vertical direction.

In addition, the coupling-type meta pattern 180a may have a structure in which first coupling-type meta patterns 187a, second coupling-type meta patterns 182a, third coupling-type meta patterns 183a, fourth coupling-type meta patterns 184a, fifth coupling-type meta patterns 185a, and sixth coupling-type meta patterns 186a are arranged in parallel with each other.

For example, the first ring-type meta patterns 137a may be disposed on the same level as a level on which the patch antenna pattern 110a and the first coupling-type meta patterns 187a of the coupling-type meta patterns 180a are disposed. The second ring-type meta patterns 132a may be disposed on the same level as a level on which the coupling patch pattern 115a and the second coupling-type meta patterns 182a of the coupling-type meta patterns 180a are disposed. Therefore, the ring-type meta patterns 130a and the coupling-type meta patterns 180a may more efficiently guide the RF signals propagated through from the patch antenna pattern 110a in the z-direction.

Referring to FIG. 2C, the coupling-type meta patterns 180a may be arranged so that some and the others thereof overlap each other in the vertical direction, and may be arranged to be electrically disconnected from each other.

That is, the coupling-type meta patterns 180a may be configured so that they do not include vias connecting the first to sixth coupling-type meta patterns 187a, 182a, 183a, 184a, 185a, and 186a to each other.

The vias may act as an inductance in terms of an equivalent circuit. Since the coupling-type meta patterns 180a are coupled to the coupling-type meta patterns of an adjacent antenna apparatus and ring-type meta patterns 103a, respectively, the coupling-type meta patterns 180a may have a relatively great capacitance. Therefore, the coupling-type meta patterns 180a may not include the vias so as to have a relatively small inductance for impedance balance of all of the meta patterns. However, since the inductance and the capacitance may be changed depending on a design, the coupling-type meta patterns 180a may also be configured to include the vias depending on a design of the antenna apparatus.

The ring-type meta patterns 130a and the coupling-type meta patterns 180a may be electrically disconnected from the ground layer 125a, and thus may result in the meta patterns having characteristics more adaptive to an RF signal with a frequency adjacent to a frequency band of the patch antenna pattern 110a to further increase bandwidth. However, the antenna apparatus in the present disclosure may be configured to include grounding vias (not illustrated) electrically connecting the meta patterns and the ground layer 125a to each other depending on design intent, such that the antenna apparatus may be designed in terms of operation stability.

Figure 2D:
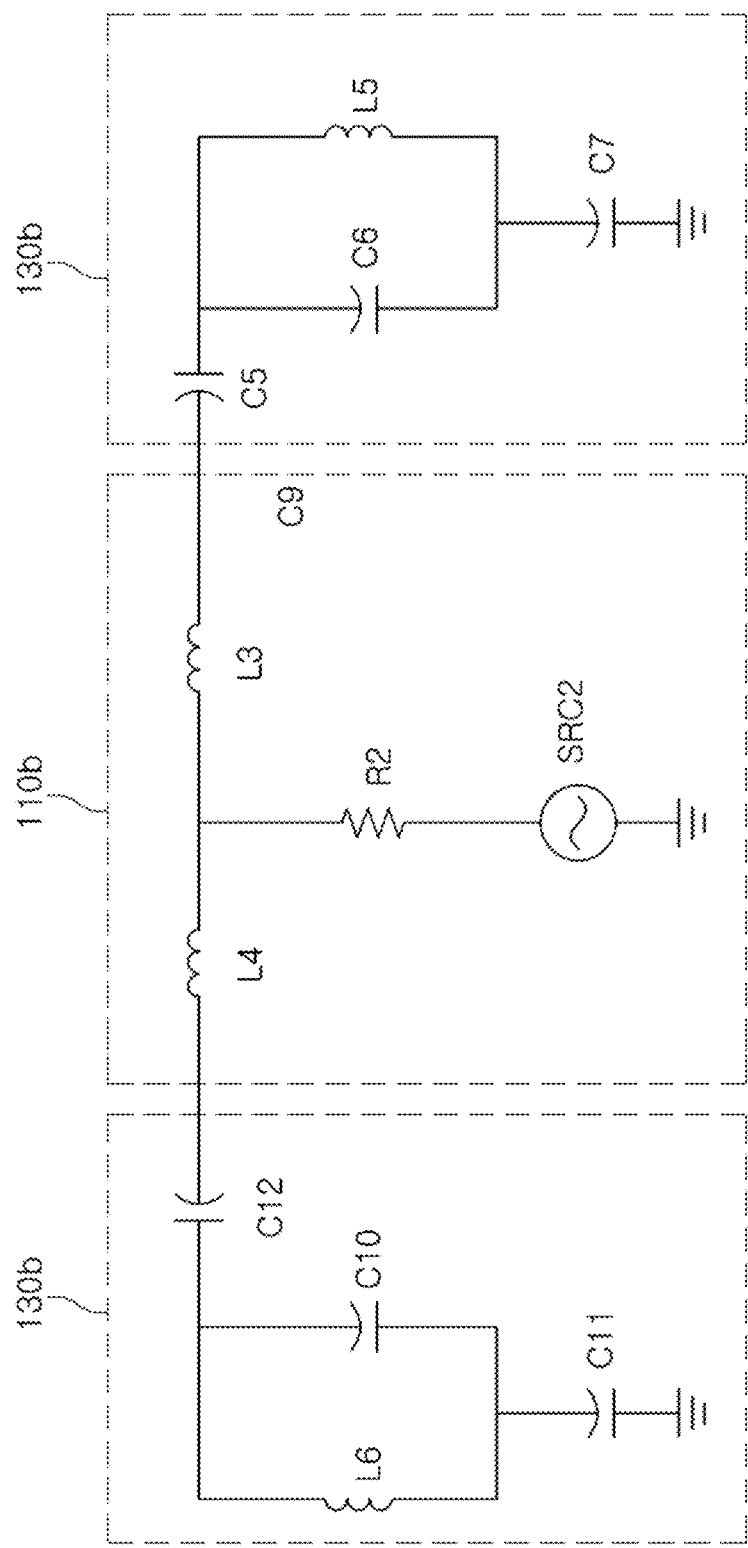
FIG. 2D is a circuit diagram illustrating an example of an equivalent circuit of the antenna apparatus.

FIG. 2D is a circuit diagram illustrating an example of an equivalent circuit of the antenna apparatus in the present disclosure.

Referring to FIG. 2D, a patch antenna pattern 110b of the antenna apparatus in the present disclosure may propagate an RF signal to a source SRC2 such as an IC or receive an RF signal propagated from the source SRC2, and may have a resistance value R2 and inductances L3 and L4.

Ring-type meta patterns 130b may have capacitances C5 and C12 for the patch antenna pattern 110b, capacitances C6 and C10 between the ring-type meta patterns, inductances L5 and L6 of array vias, and capacitances C7 and C11 between the ring-type meta patterns and a ground layer.

Here, capacitances and inductances of the coupling-type meta patterns described above may be added to the capacitances and the inductances of the ring-type meta patterns 130b.

A frequency band and a bandwidth of the antenna apparatus in the present disclosure may be determined by the resistance value, the capacitances, and/or the inductances described above.

Figure 3A:
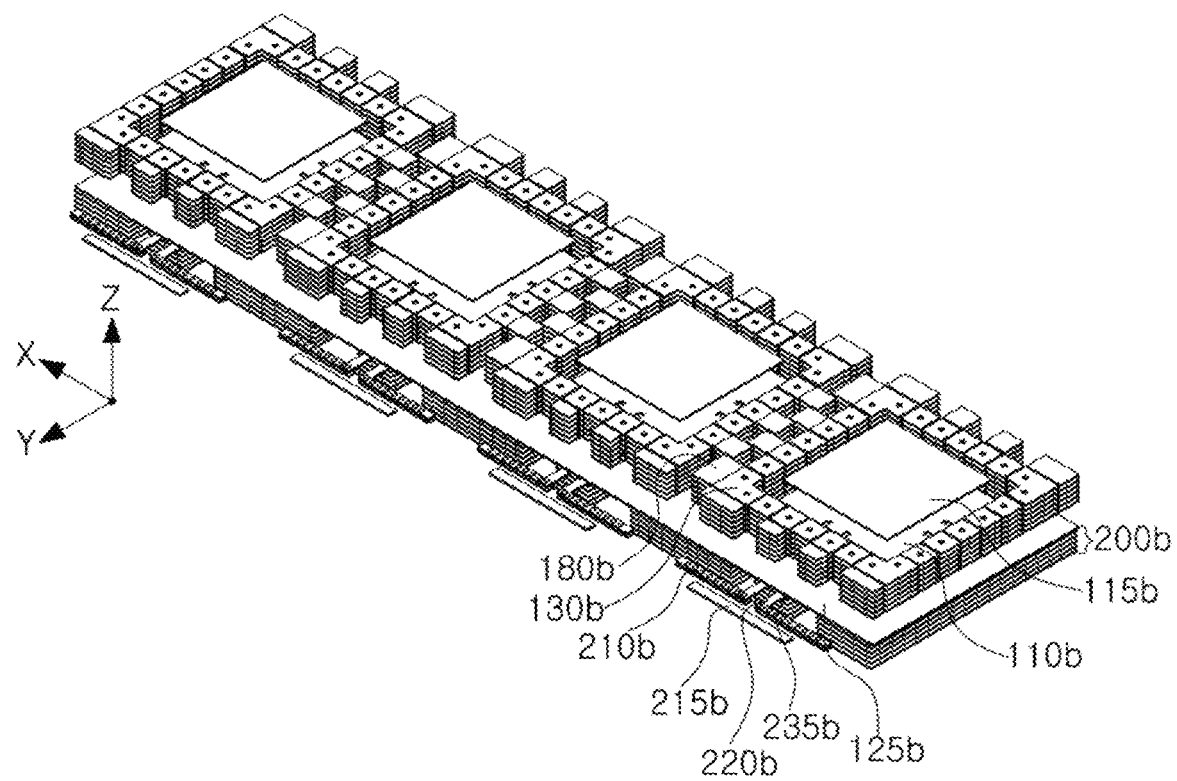
FIG. 3A is a perspective view illustrating an example of an array of patch antenna patterns of an antenna apparatus.
Figure 3B:
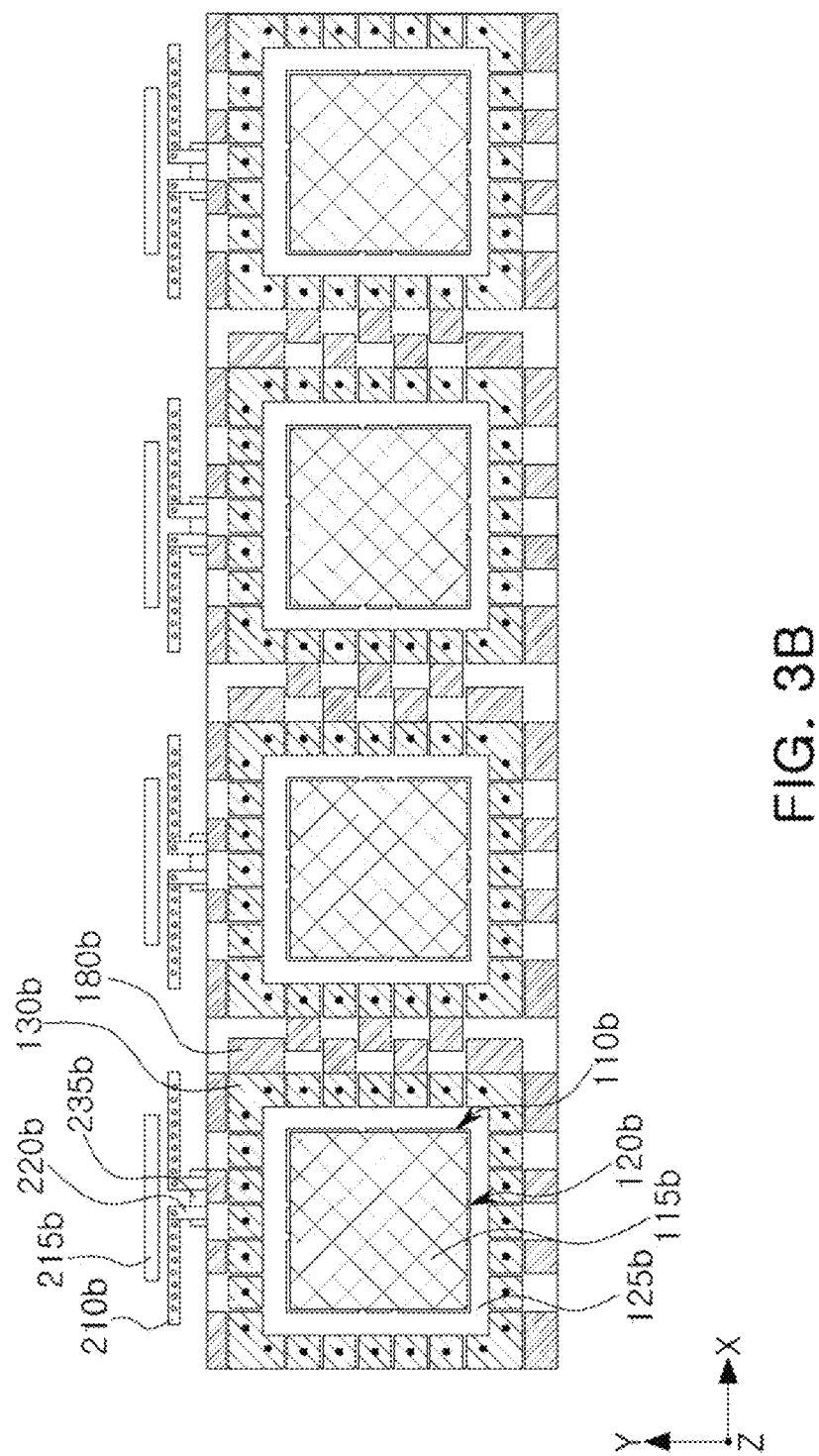
FIG. 3B is a plan view illustrating an example of an upper surface of the antenna apparatus.

FIG. 3A is a perspective view illustrating an example of an array of patch antenna patterns of an antenna apparatus, and FIG. 3B is a plan view illustrating an example of an upper surface of the antenna apparatus.

Referring to FIGS. 3A and 3B, an antenna apparatus in the present disclosure may include at least some of patch antenna patterns 110b, coupling patch patterns 115b, feed vias, a ground layer 125b, ring-type meta patterns 130b, coupling-type meta patterns 180b, a connection member 200b, end-fire antenna patterns 210b, director patterns 215b, feed lines 220b, and coupling ground patterns 235b.

The patch antenna patterns 110b and the coupling patch patterns 115b may be arranged in the first direction (for example, the x-direction).

That is, the patch antenna patterns 110b may be arranged in a 1×n array. Here, n is a natural number of 2 or more. The antenna apparatus in which the patch antenna patterns 110b are arranged in a 1×n array may be efficiently disposed at an edge of an electronic device.

The ring-type meta patterns 130b may be arranged to surround each of the patch antenna patterns 110b.

The coupling-type meta patterns 180b may be arranged to surround the ring-type meta patterns 130b.

The end-fire antenna patterns 210b may be disposed to be spaced apart from each of the patch antenna patterns 110b in the second direction (for example, the y-direction) when viewed in the vertical direction (the z-direction).

Here, some of the ring-type meta patterns 130b may be arranged between the end-fire antenna patterns 210b and the patch antenna patterns 110b when viewed in the vertical direction (the z-direction).

Therefore, electromagnetic isolation between the patch antenna patterns 110b and the end-fire antenna patterns 210b may be improved.

In addition, some of the coupling-type meta patterns 180b may be arranged between the end-fire antenna patterns 210b and the patch antenna patterns 110b when viewed in the vertical direction (the z-direction).

Since the coupling-type meta patterns 180b are arranged to be sparser, or in fewer numbers, than the ring-type meta patterns 130b, the coupling-type meta patterns 180b may provide wider electromagnetic boundary surfaces with respect to the end-fire antenna patterns 210b.

Therefore, RF signals leaked from the end-fire antenna patterns 210b to the patch antenna patterns 110b may be more efficiently reflected on electromagnetic boundary surfaces of the coupling-type meta patterns 180b, and may be further concentrated and reflected in the second direction (for example, the y-direction). Therefore, antenna performance of the end-fire antenna patterns 210b may be further improved.

FIGS. 3C through 3F are plan views illustrating examples of the respective layers of the antenna apparatus in the present disclosure.

Figure 3C:
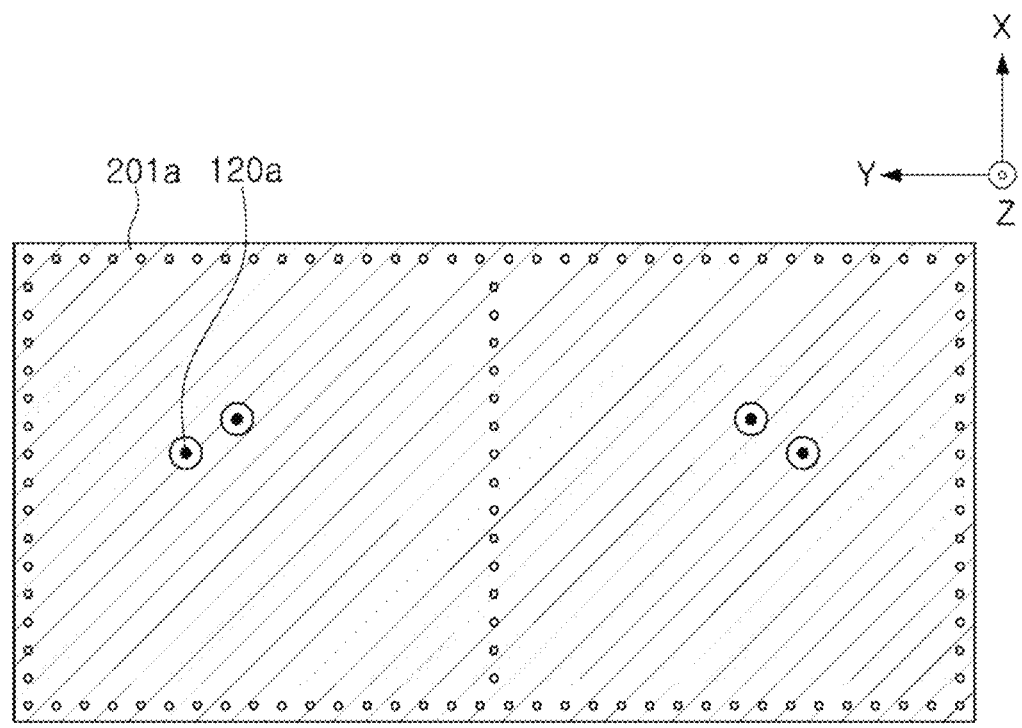
FIGS. 3C through 3F are plan views illustrating an example of the respective layers of the antenna apparatus.

Referring to FIG. 3C, a ground layer 201a may have through-holes through which the feed vias 120a pass. The ground layer 201a may electromagnetically shield the patch antenna pattern 110a and the feed lines from each other.

Figure 3D:
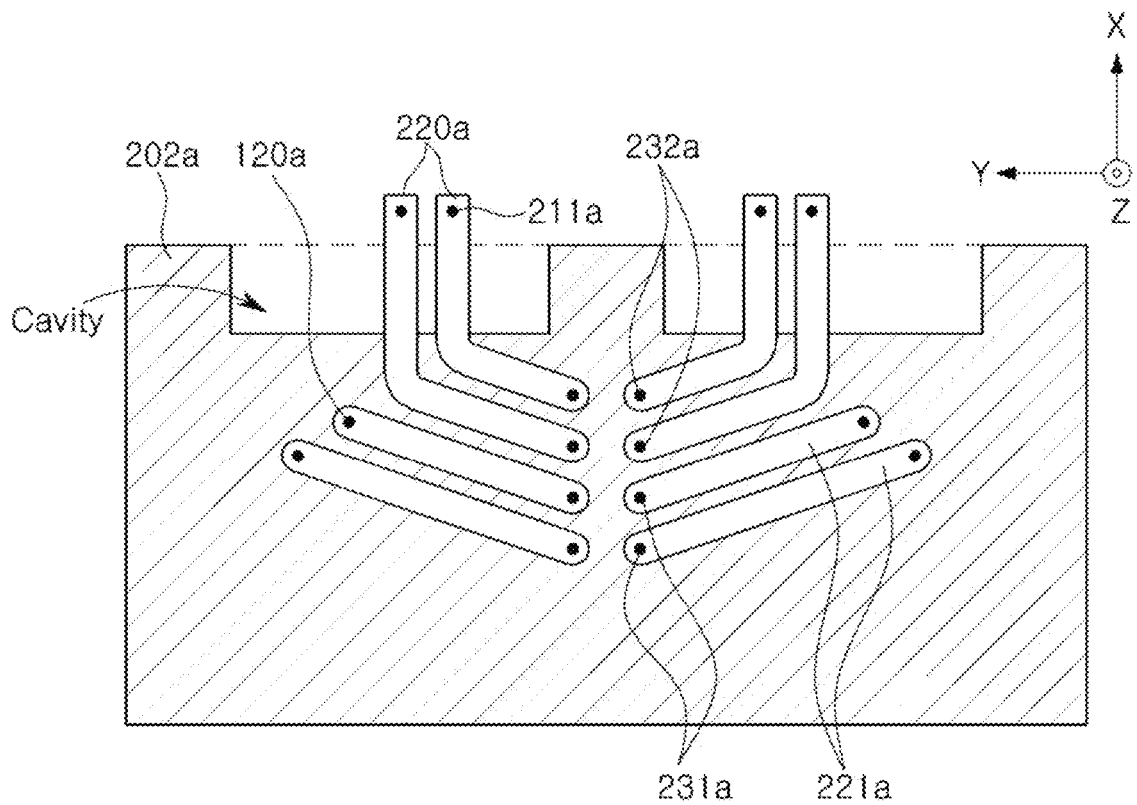

Referring to FIG. 3D, the wiring ground layer 202a may surround at least portions of the feed lines 220a and patch antenna feed lines 221a. The feed lines 220a may be electrically connected to second wiring vias 232a, and the patch antenna feed lines 221a may be electrically connected to first wiring vias 231a. The wiring ground layer 202a may electromagnetically shield the feed lines 220a and the patch antenna feed lines 221a from each other. One of the ends of the feed lines 220a may be connected to second feed vias 211a.

Figure 3E:
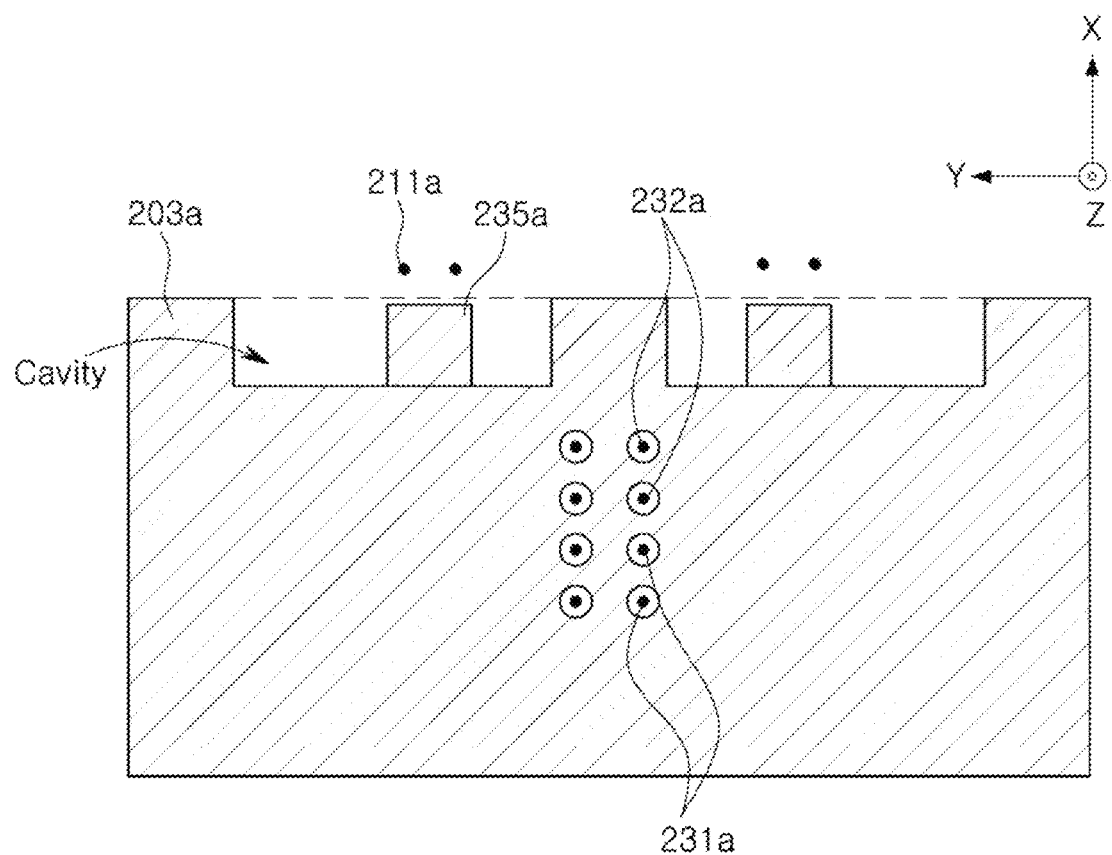

Referring to FIG. 3E, the second ground layer 203a may have through-holes through which the first wiring vias 231a and the second wiring vias 232a pass, and may have coupling ground patterns 235a. The second ground layer 203a may electromagnetically shield the feed lines and the IC from each other.

Figure 3F:
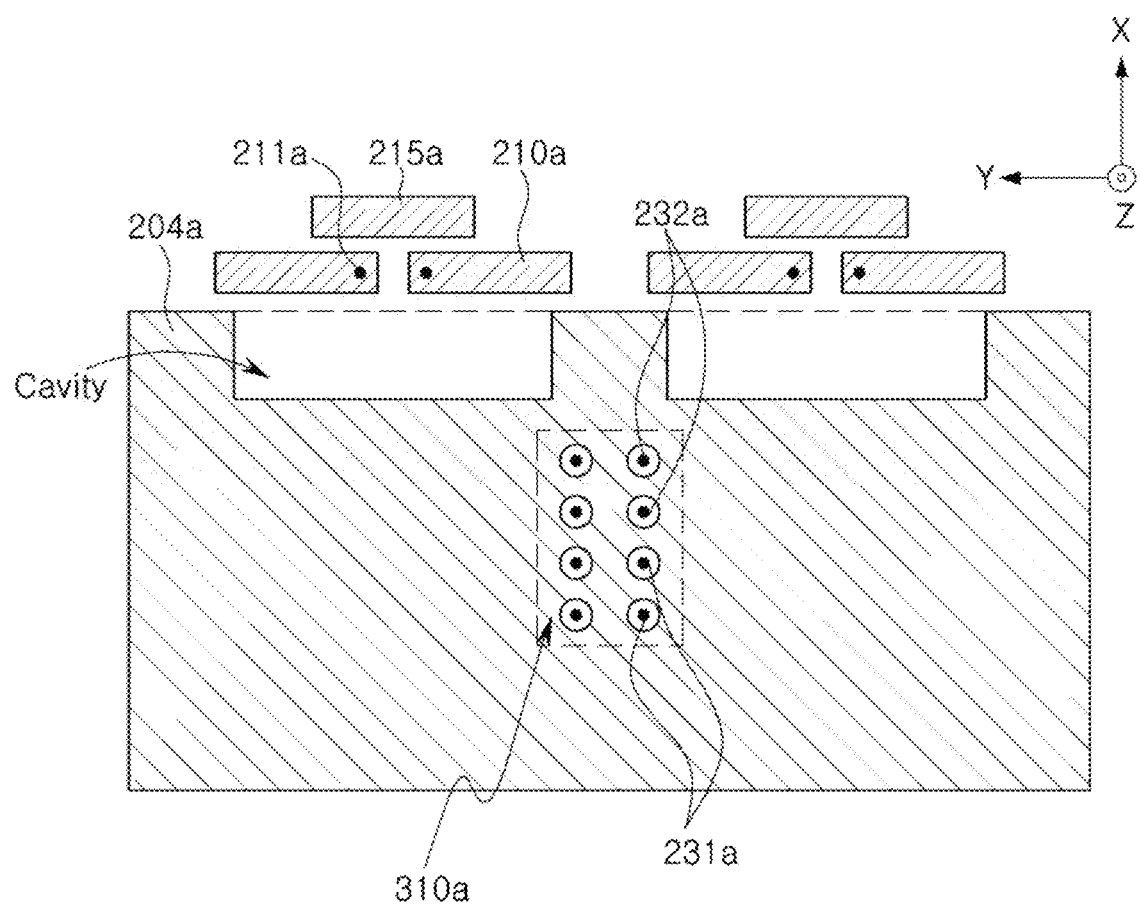

Referring to FIG. 3F, the IC ground layer 204a may have through-holes through which the first wiring vias 231a and the second wiring vias 232a pass. The IC 310a may be disposed below the IC ground layer 204a, and may be electrically connected to the first wiring vias 231a and the second wiring vias 232a. The end-fire antenna patterns 210a and the director patterns 215a may be disposed on a level that is substantially the same as that of the IC ground layer 204a.

The IC ground layer 204a may provide a ground used in a circuit of the IC 310a and/or a passive component to the IC 310a and/or the passive component. Depending on a design intent, the IC ground layer 204a may provide transfer paths of power and signals used in the IC 310a and/or the passive component. Therefore, the IC ground layer 204a may be electrically connected to the IC and/or the passive component.

Each of the wiring ground layer 202a, the second ground layer 203a, and the IC ground layer 204a may have a depressed shape so as to provide cavities. Therefore, the end-fire antenna pattern 210a may be disposed closer to the IC ground layer 204a.

A positional relationship among the wiring ground layer 202a, the second ground layer 203a, and the IC ground layer 204a in the vertical direction and a shape of each of the wiring ground layer 202a, the second ground layer 203a, and the IC ground layer 204a may be changed depending on a design.

Figure 4A:
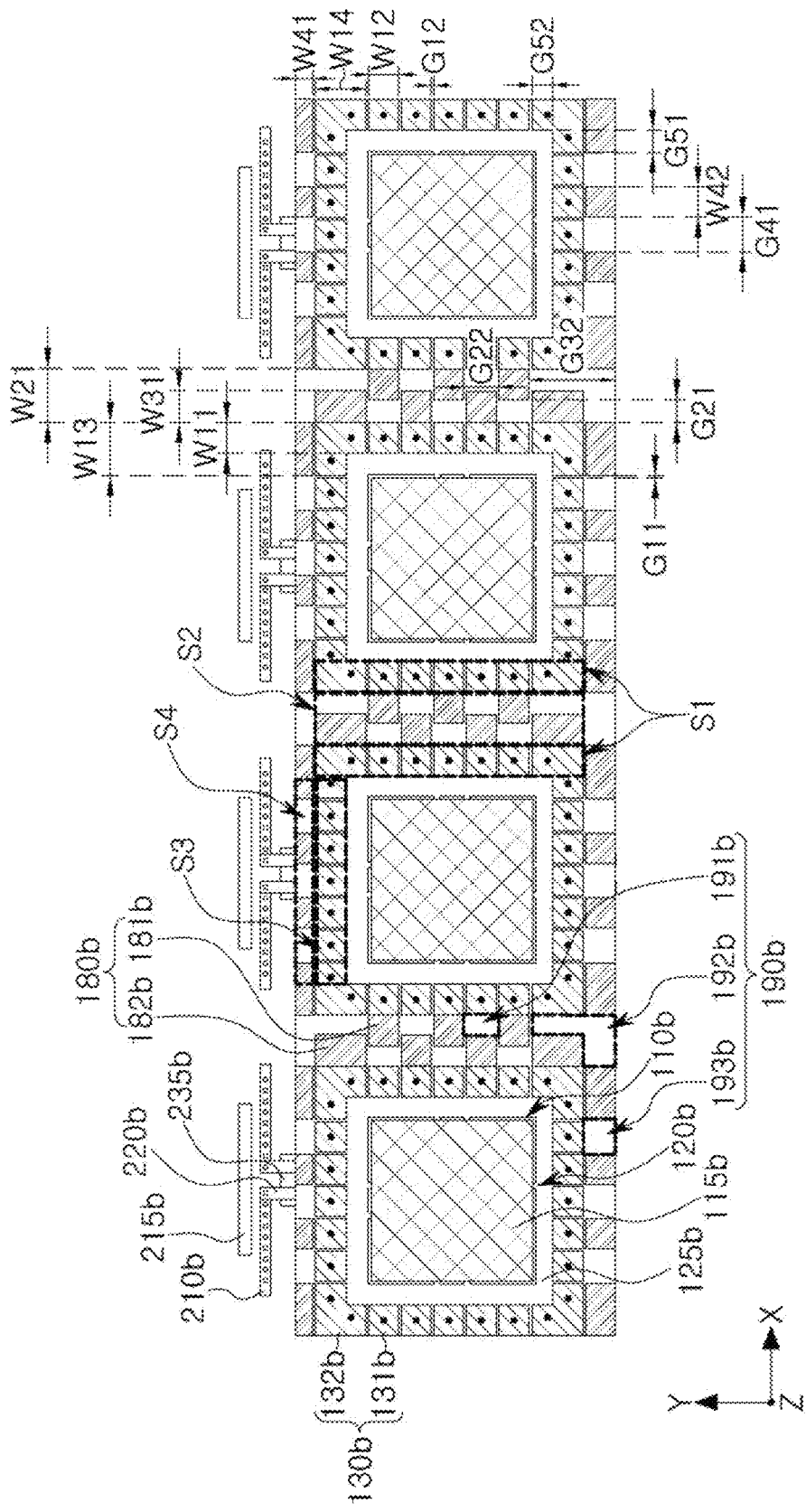
FIG. 4A is a plan view illustrating examples of dimensions of the antenna apparatus.

FIG. 4A is a plan view illustrating an example of dimensions of the antenna apparatus in the present disclosure.

Referring to FIG. 4A, the ring-type meta patterns 130b may be arranged in first and third regions S1 and S3, and the coupling-type meta patterns 180b may be arranged in second and fourth regions S2 and S4. The second region S2 may be disposed between the first regions S1. The fourth region S4 may be disposed to be more distant from the patch antenna patterns 110b and/or the coupling patch patterns 115b than the third region S3 is.

The ring-type meta patterns 130b may be arranged to have spaces therebetween. The spaces may have first gaps G11 and G12. The first gap G11 in the first direction and the first gap G12 in the second direction may be the same as each other, but are not limited thereto.

Each of the ring-type meta patterns 130b may have a first length W11 in the first direction and a first length W12 in the second direction. The first length W11 in the first direction and the first length W12 in the second direction may be the same as each other, but are not limited thereto. For example, the first length W11 in the first direction and the first length W12 in the second direction may be 10 times or more to 12 times or less the first gap G11 in the first direction and the first gap G12 in the second direction, respectively.

Each of the cavities 190b may have second gaps G21 and G22 greater than the first gaps G11 and G12. Therefore, the cavity 190b may be greater than the space between the ring-type meta patterns 130b. Therefore, the cavities 190b may assist electromagnetic bandgap characteristics of the coupling-type meta patterns 180b to further improve electromagnetic isolation between the patch antenna patterns 110b. The cavities and the coupling-type meta patterns alternate to formed a checkered or alternate pattern between the ring-type meta patterns.

Each of the cavities 190b may have a second gap G21 in the first direction and a second gap G22 in the second direction, and the second gap G21 in the first direction may be smaller than the second gap G22 in the second direction. That is, each of the cavities 190b may have a polygonal shape in which a length in the first direction and a length in the second direction perpendicular to the first direction are different from each other.

Therefore, in the antenna apparatus in the present disclosure, the electromagnetic isolation between the patch antenna patterns 110b may be established, and the antenna apparatus may be miniaturized by reducing sizes of the first regions S1. For example, the second gap G21 in the first direction may exceed ½ of the second gap G22 in the second direction and be less than ¾ of the second gap G22 in the second direction, but is not limited thereto.

Each of the coupling-type meta patterns 180b may have a third length W31 in the first direction and a first length W12 in the second direction.

One of the sides of the coupling-type meta patterns 180b may be disposed to be spaced apart from the ring-type meta patterns 130b by the first gap G11 in the first direction. The other sides of the coupling-type meta patterns 180b may be disposed to be spaced apart from the ring-type meta patterns 130b by the second gap G21 in the first direction greater than the first gap G11 in the first direction. Therefore, the cavities 190b may be uniformly arranged, and thus, more efficiently assist electromagnetic bandgap characteristics of the coupling-type meta patterns 180b.

Depending on a design intent, the coupling-type meta patterns 180b may be arranged so that portions thereof have spaces therebetween. The spaces may have the same gap as the first gap G12 in the second direction. Therefore, the coupling-type meta patterns 180b may improve electromagnetic coupling efficiency without sacrificing electromagnetic bandgap characteristics, while forming the cavities 190b.

Depending on a design intent, each of the coupling-type meta patterns 180b may have a polygonal shape in which the third length W31 in the first direction is greater than the first length W11 in the first direction or greater than the first length W12 in the second direction. Therefore, the coupling-type meta patterns 180b may improve electromagnetic coupling efficiency while forming the cavities 190b. For example, the third length W31 in the first direction may exceed 1 times the first length W11 in the first direction and be 1.2 times or less the first length W11 in the first direction, but is not limited thereto.

The second gap G21 in the first direction in each of the cavities 190b may be smaller than the third length W31 in the first direction in each of the coupling-type meta patterns 180b. Therefore, each of the cavities 190b may have an area smaller than that of each of the coupling-type meta patterns 180b. Therefore, in the antenna apparatus in the present disclosure, the electromagnetic isolation between the patch antenna patterns 110b may be established, and the antenna apparatus may be miniaturized by reducing sizes of the first regions S1.

Meanwhile, coupling-type meta patterns 182b arranged at corners in the second direction (for example, the y-direction) among the coupling-type meta patterns 180b may be greater than coupling-type meta patterns 181b arranged at the center in the second direction among the coupling-type meta patterns 180b.

That is, the coupling-type meta patterns 180b may surround the patch antenna pattern 110b so as to form a polygon, and the coupling-type meta patterns 182b corresponding to corners of the polygon among the coupling-type meta patterns may be greater than the coupling-type meta patterns 181b corresponding to sides of the polygon among the coupling-type meta patterns.

Therefore, the coupling-type meta patterns 180b may improve array balance at the corners in the second direction (for example, the y-direction) while forming the cavities 190b, and may thus improve electromagnetic bandgap characteristic stability and electromagnetic coupling efficiency.

In other words, by adjusting the sizes of the coupling-type meta patterns 181b and/or the coupling-type meta patterns 182b, corners in the array could be made electrically and magnetically equal in magnitude, but in opposite directions.

For example, each of the coupling-type meta patterns 182b arranged at the corners among the coupling-type meta patterns 180b may have a third length W13 in the first direction greater than the first length W11 in the first direction, and may have a third length W14 in the second direction greater than the first length W12 in the second direction.

Likewise, the ring-type meta patterns 130b may surround the patch antenna pattern 110b so as to form a polygon. Ring-type meta patterns 132b corresponding to corners of the polygon among the ring-type meta patterns may be greater than ring-type meta patterns 131b corresponding to sides of the polygon among the ring-type meta patterns. Likewise, cavities 192b corresponding to the corners of the polygon among the cavities 190b may be greater than cavities 191b and 193b corresponding to the sides of the polygon among the cavities 190b.

Therefore, the coupling-type meta patterns 180b may improve array balance at the corners in the second direction (for example, the y-direction) while forming the cavities 190b, and may thus improve electromagnetic bandgap characteristic stability and electromagnetic coupling efficiency.

Meanwhile, each of coupling-type meta patterns disposed between the patch antenna pattern 110b and the end-fire antenna patterns 210b among the coupling-type meta patterns 180b may have a fourth length W42 in the first direction and a fourth length W41 in the second direction. The fourth length W42 in the first direction may be the same as the first length W11 in the first direction, and the fourth length W41 in the second direction may be smaller than the first length W12 in the second direction, but the fourth length W42 in the first direction and the fourth length W41 in the second direction are not limited thereto.

Meanwhile, the ring-type meta patterns 130b may be spaced apart from the patch antenna patterns 110b by a fifth gap G51 in the first direction and a second gap G52 in the second direction.

Here, the second gap G21 in the first direction in each of the cavities 190b may be smaller than the fifth gap G51 in the first direction, and may be smaller than the fifth gap G52 in the second direction. Therefore, the coupling-type meta patterns 180b may improve electromagnetic barrier performance of the cavities 190b, and improve electromagnetic coupling efficiency.

Meanwhile, the coupling-type meta patterns 180b may have a form in which portions of coupling-type meta patterns closer to a portion (for example, an edge of one side in the first direction) of the patch antenna patterns 110b and portions of coupling-type meta patterns closer to the other portion (for example, an edge of the other side in the first direction) of the patch antenna patterns 110b are alternately inserted with respect to each other.

Therefore, the coupling-type meta patterns 180b may improve electromagnetic coupling efficiency without scarifying electromagnetic bandgap characteristics, while forming the cavities 190b.

Depending on a design, the coupling-type meta patterns 180b may also have forms in which they are not alternately inserted with respect to each other, as illustrated in FIGS. 4B through 4G.

FIGS. 4B through 4G are plan views illustrating examples of various forms of coupling-type meta patterns of the antenna apparatus in the present disclosure.

Referring to FIGS. 4B to 4F, coupling-type meta patterns 180c, 180d, 180e, 180f, and 180g may be arranged in N zigzag rows, where N is a natural number. Therefore, the coupling-type meta patterns 180c, 180d, 180e, 180f, and 180g may establish electromagnetic bandgap characteristics and electromagnetic barrier performance of cavities 190c, 190d, 190e, 190f, and 190g in a harmonious manner.

Referring to FIGS. 4B through 4F, ring-type meta patterns 130c, 130d, 130e, 130f, and 130g may be arranged in N rows. That is, the number of rows of each of the ring-type meta patterns 130c, 130d, 130e, 130f, and 130g may be the same as that of rows of each of the coupling-type meta patterns 180c, 180d, 180e, 180f, and 180g. Therefore, the antenna apparatus in the present disclosure may use relatively high regularity of the ring-type meta patterns 130c, 130d, 130e, 130f, and 130g, and relatively high electromagnetic barrier performance of the coupling-type meta patterns 180c, 180d, 180e, 180f, and 180g in a harmonious manner.

Referring to FIGS. 4B through 4F, the cavities 190c, 190d, 190e, 190f, and 190g may be formed by side boundaries of the ring-type meta patterns 130c, 130d, 130e, 130f, and 130g and flexion of the zigzag rows of the coupling-type meta patterns 180c, 180d, 180e, 180f, and 180g, respectively. Therefore, the cavities 190c, 190d, 190e, 190f, and 190g may be arranged in the zigzag rows, may improve electromagnetic barrier performance, and may efficiently assist the electromagnetic bandgap characteristics of the coupling-type meta patterns 180c, 180d, 180e, 180f, and 180g.

Referring to FIGS. 4B through 4G, cavities 190c, 190d, 190e, 190f, 190g, and 190h may be arranged in a mosaic structure with respect to the coupling-type meta patterns 180c, 180d, 180e, 180f, 180g, and 180h, respectively. Therefore, the cavities 190c, 190d, 190e, 190f, 190g, and 190h and the coupling-type meta patterns 180c, 180d, 180e, 180f, 180g, and 180h may have relatively high array regularity and be complementarily coupled to each other, and thus establish electromagnetic bandgap characteristics and electromagnetic barrier performance in harmonious manner.

Figure 4B:
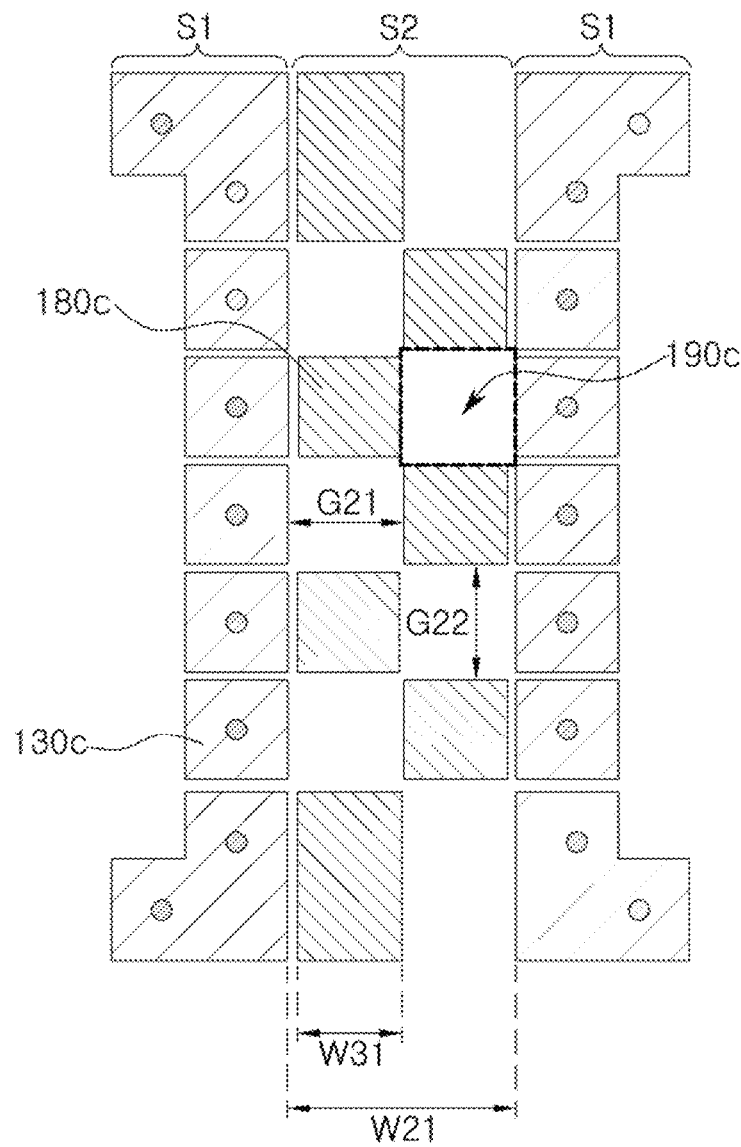
FIGS. 4B through 4G are plan views illustrating examples of various forms of coupling-type meta-patterns of the antenna apparatus.

Referring to FIG. 4B, each of the cavities 190c may have a second gap G21 in the first direction greater than the second gap in the first direction in each of the cavities illustrated in FIG. 4A. For example, the second gap G21 in the first direction may be the same as a third length W31 in the first direction in each of the coupling-type meta patterns 180c.

Figure 4C:
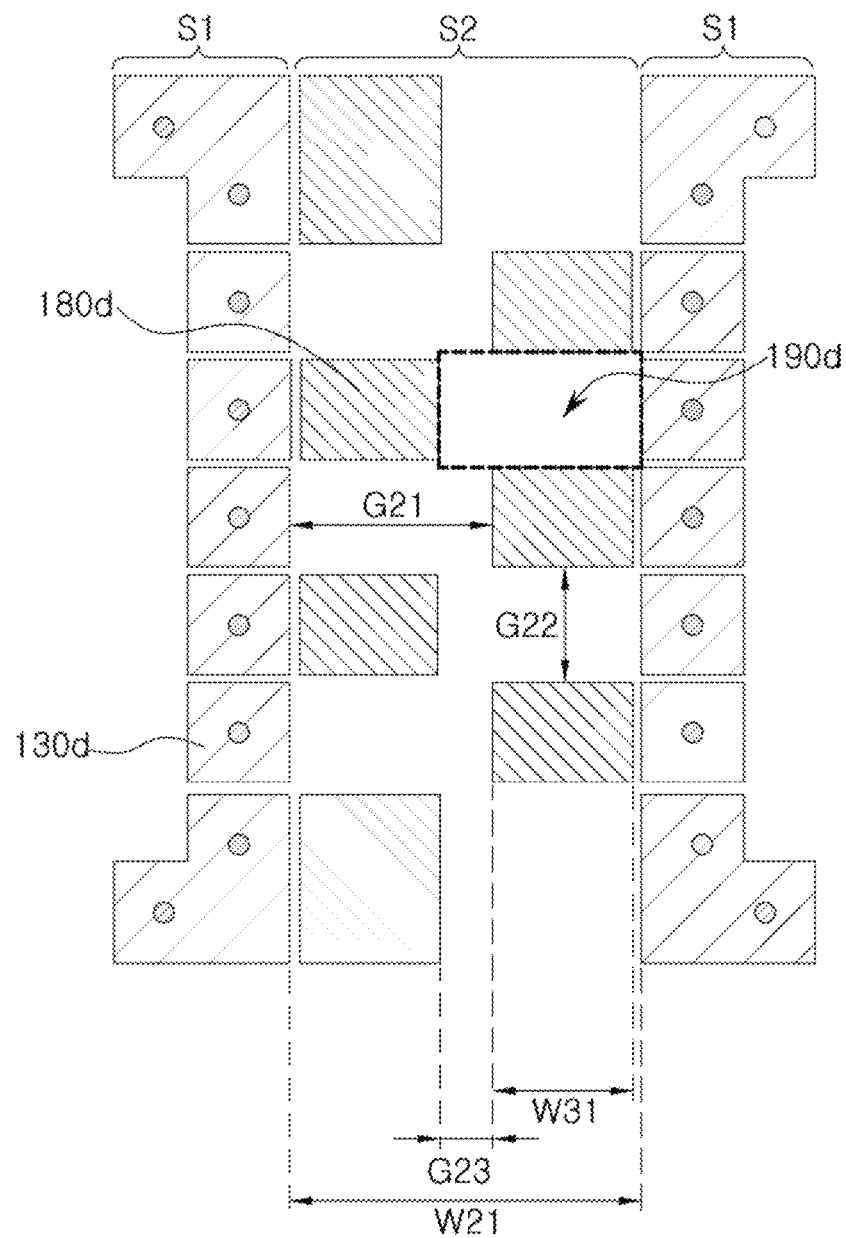

Referring to FIG. 4C, each of the cavities 190d may have a second gap G21 in the first direction greater than the second gap in the first direction in each of the cavities illustrated in FIG. 4B. For example, the second gap G21 in the first direction may extend from the third length W31 in the first direction in each of the coupling-type meta patterns 180b by an extending gap G23. For example, a third length W31 in the first direction in each of the coupling-type meta patterns 180d may be greater than the third length in the first direction in each of the coupling-type meta patterns illustrated in FIG. 4A.

Figure 4D:
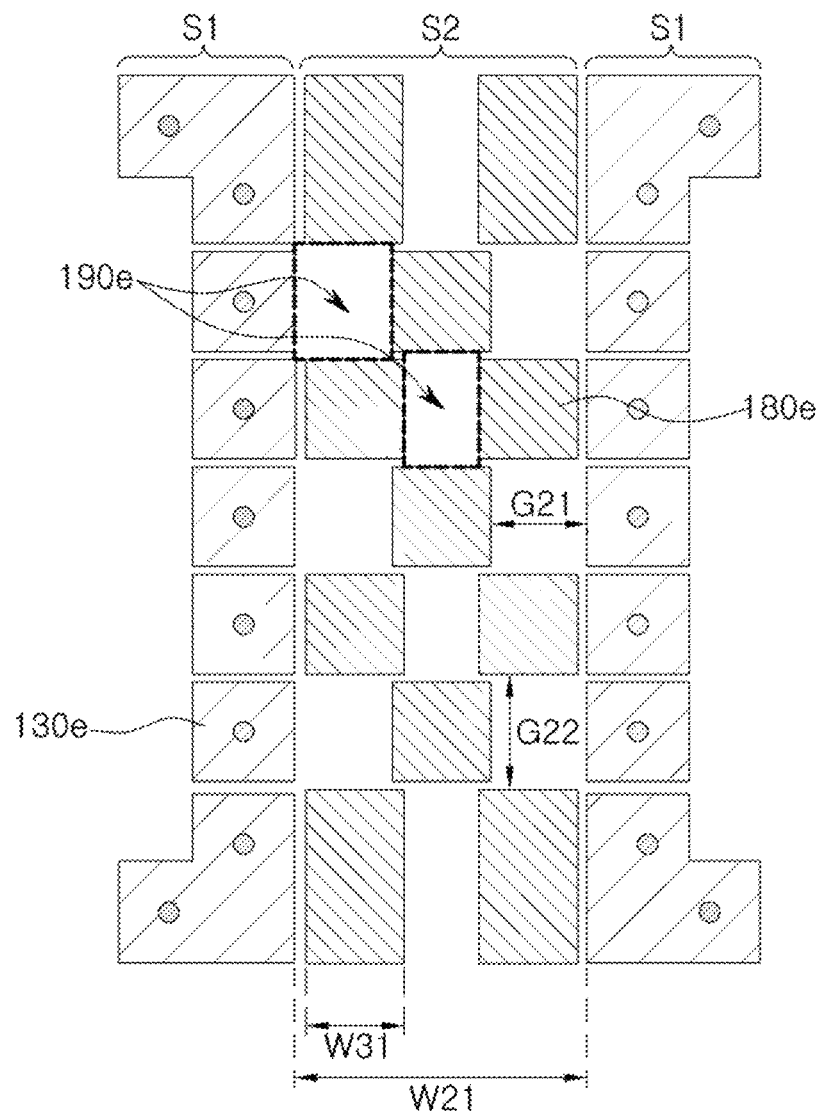

Referring to FIG. 4D, the coupling-type meta patterns 180e and the cavities 190e may have more rows than those of each of the coupling-type meta patterns and the cavities illustrated in FIG. 4A, respectively.

Figure 4E:
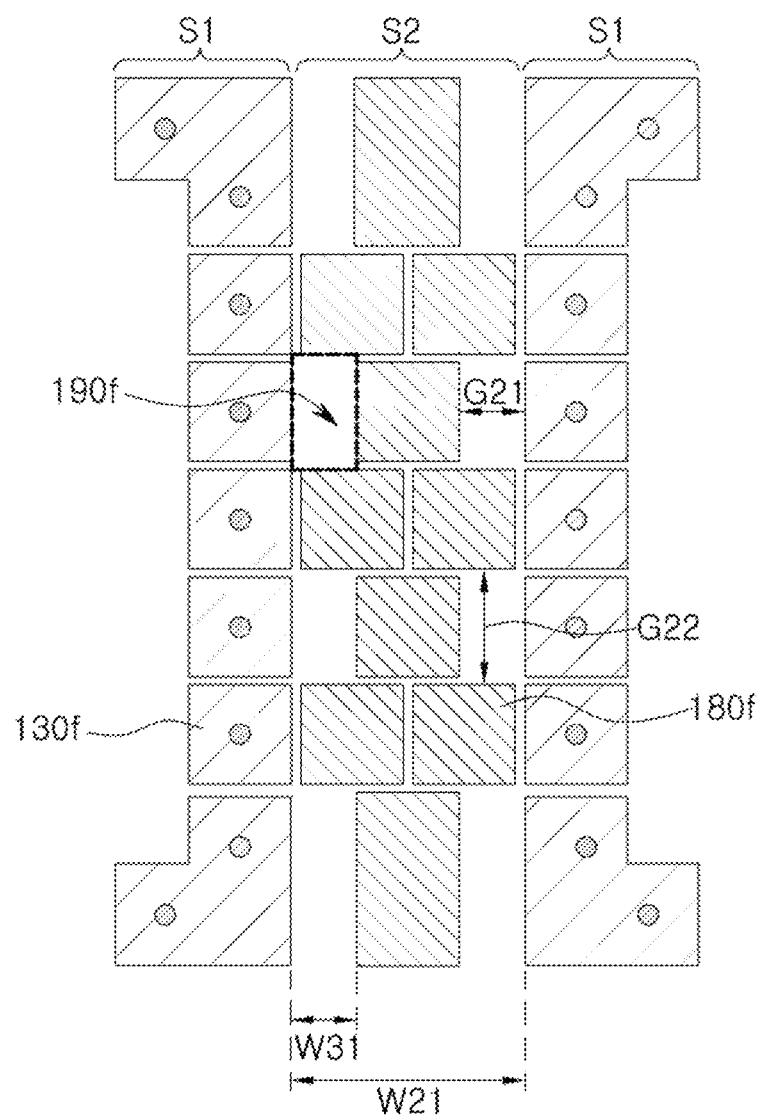

Referring to FIG. 4E, the cavities 190f may have more rows than those of the cavities illustrated in FIG. 4A.

Figure 4F:
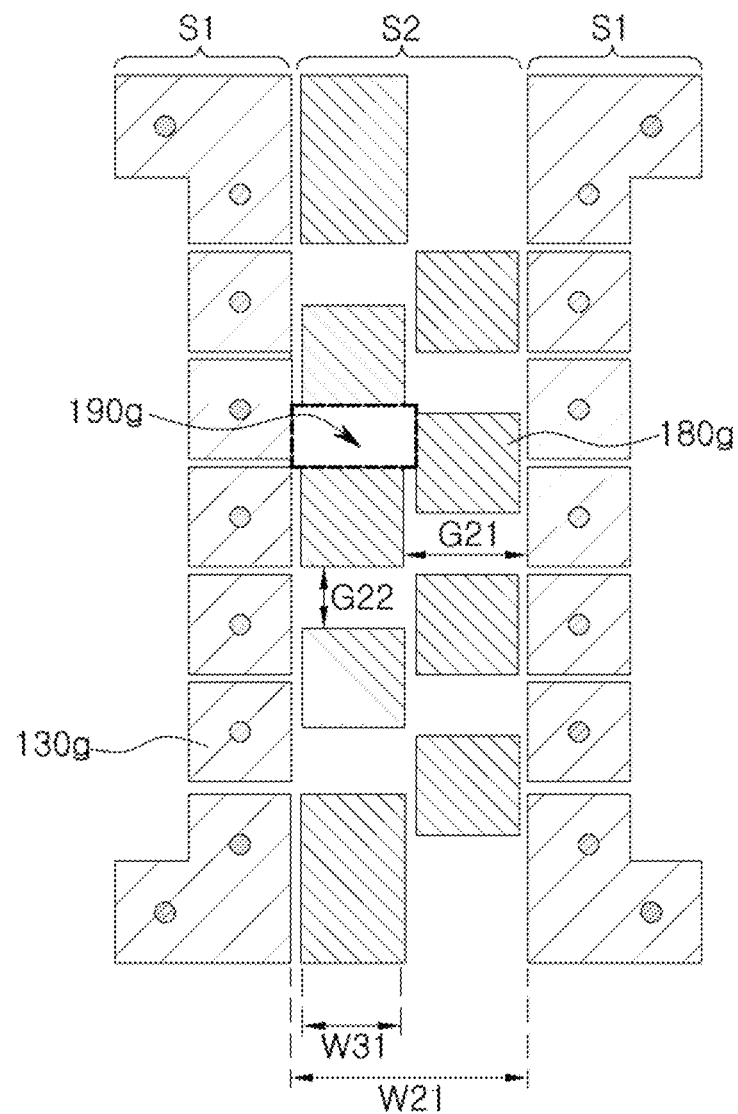

Referring to FIG. 4F, each of the cavities 190g may have a second gap G22 in the second direction smaller than the second gap in the second direction in each of the cavities illustrated in FIG. 4A.

Figure 4G:
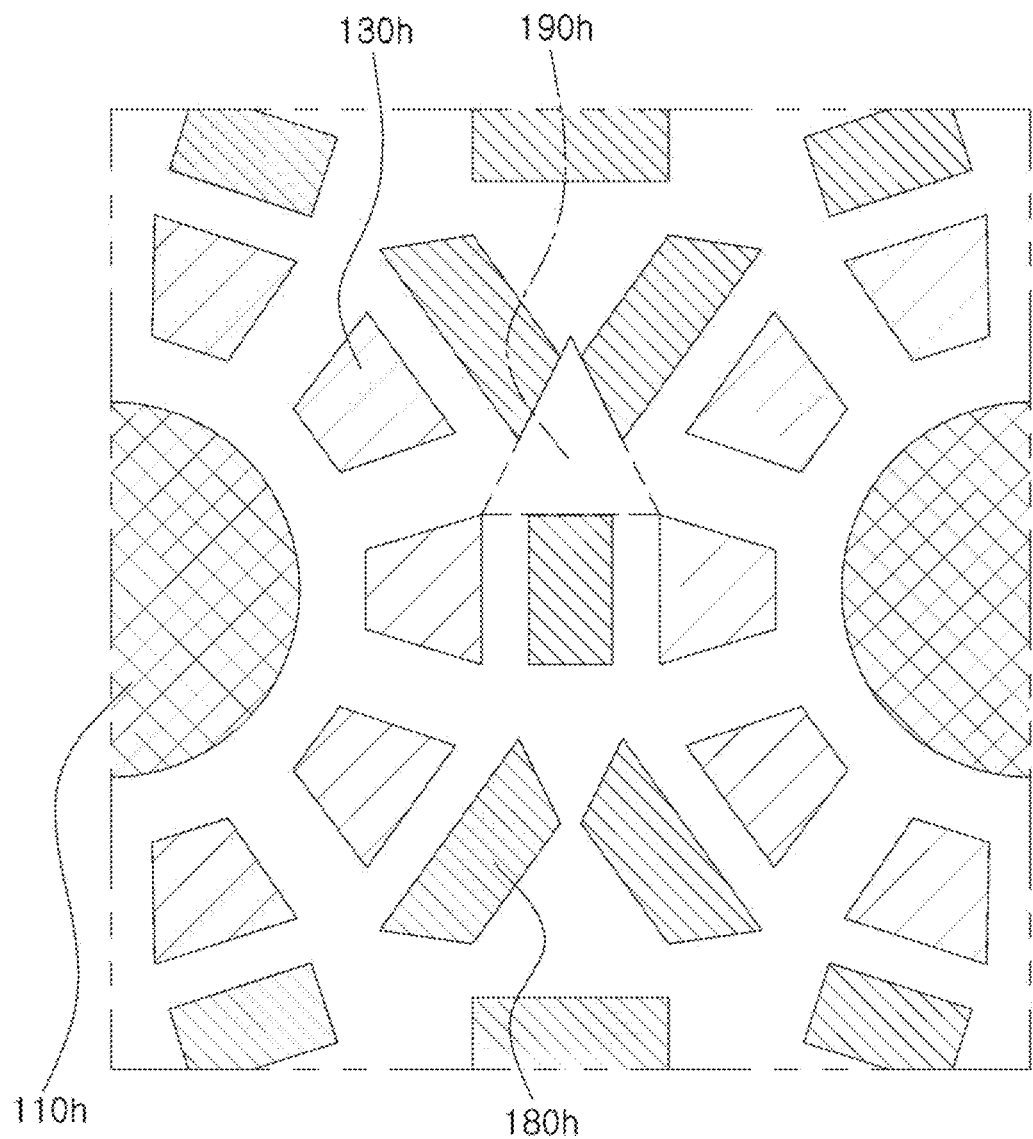

Referring to FIG. 4G, a patch antenna pattern 110h may have a circular shape, each of ring-type meta patterns 130h and the coupling-type meta patterns 180h may have a trapezoidal shape, and the cavity 190h may have a triangular shape. That is, shapes of the respective components of the antenna apparatus in the present disclosure are not limited to a rectangular shape.

Figure 5A:
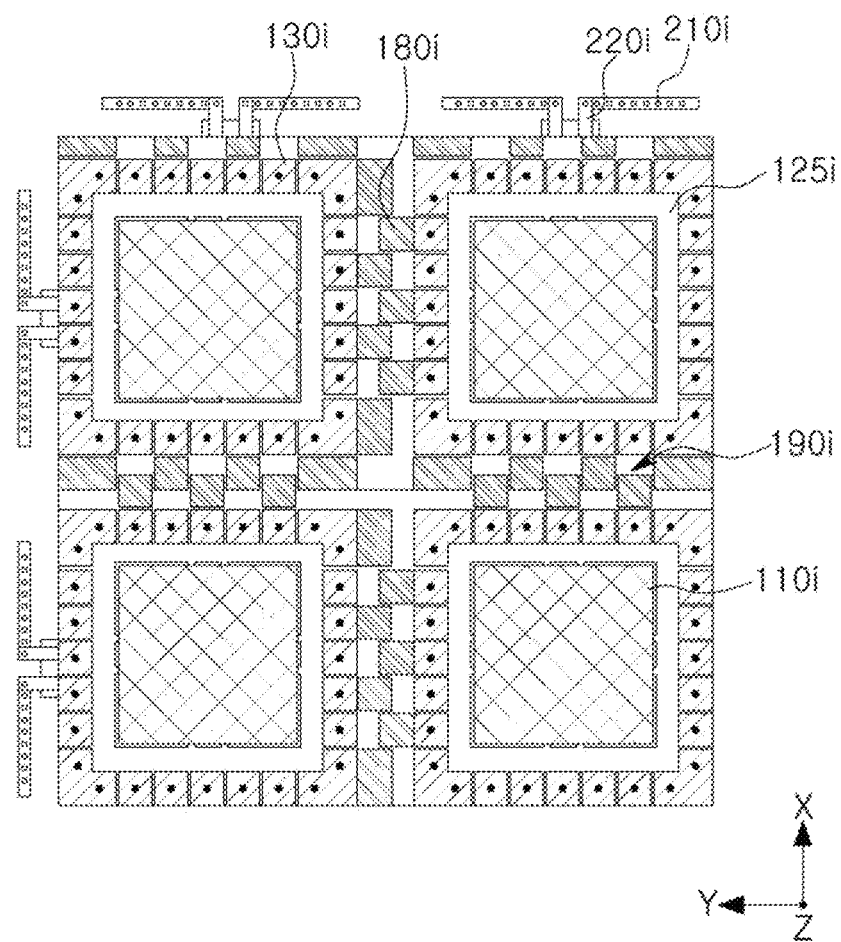
FIG. 5A is a plan view illustrating an example of an array of patch antenna patterns of an antenna apparatus.

FIG. 5A is a plan view illustrating an example of an array of patch antenna patterns of an antenna apparatus in the present disclosure.

Referring to FIG. 5A, an antenna apparatus in the present disclosure may include at least some of patch antenna patterns 110i, a ground layer 125i, ring-type meta patterns 130i, coupling-type meta patterns 180i, cavities 190i, end-fire antenna patterns 210i, and feed lines 220i.

The patch antenna patterns 110i may be arranged in an m×n array, where m and n are natural numbers of 2 or more. Therefore, the antenna apparatus in the present disclosure may be disposed more adjacent to a corner of an electronic device.

Each of the ring-type meta patterns 130i may have a ring shape corresponding to a shape of each of the patch antenna patterns 110i, and the coupling-type meta patterns 180i may have a lattice structure.

Figure 5B:
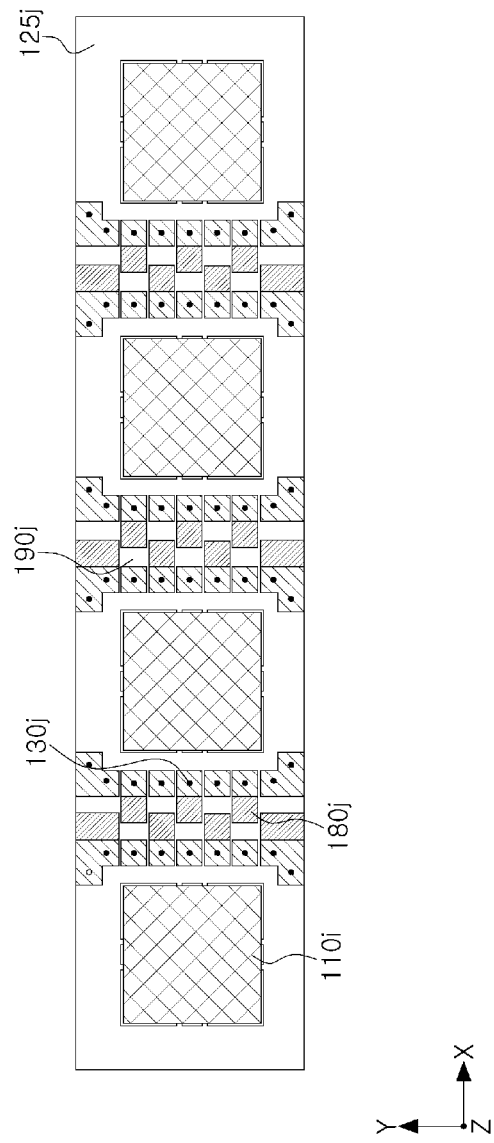
FIG. 5B is a plan view illustrating an example of an array of meta patterns of an antenna apparatus.

FIG. 5B is a plan view illustrating an example of an array of meta patterns of an antenna apparatus in the present disclosure.

Referring to FIG. 5B, an antenna apparatus in the present disclosure may include at least some of patch antenna patterns 110i, a ground layer 125j, ring-type meta patterns 130j, coupling-type meta patterns 180j, and cavities 190j.

The ring-type meta patterns 130j and the coupling-type meta patterns 180j do not completely surround the patch antenna patterns 110i, and may be disposed only between the patch antenna patterns 110i.

That is, when the coupling-type meta patterns 180j are arranged between the ring-type meta patterns 130j, a shape of each of the ring-type meta patterns 130j is not particularly to a ring shape, and may be a string shape.

Figure 6A:
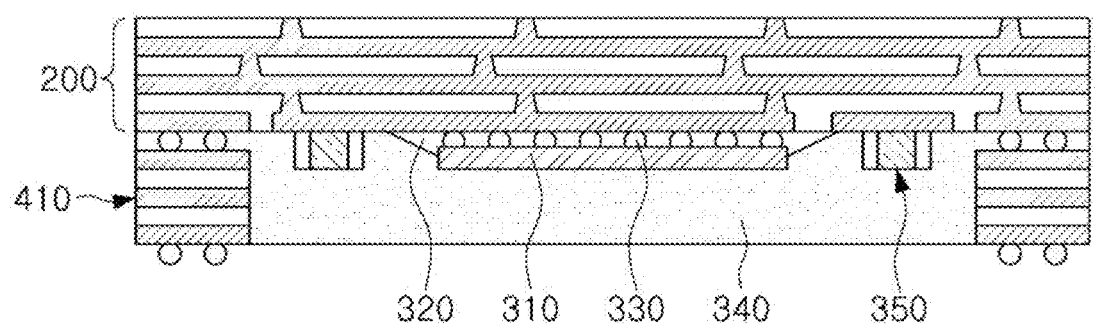
FIGS. 6A and 6B are side views illustrating examples of a lower structure of a connection member included in an antenna apparatus.
Figure 6B:
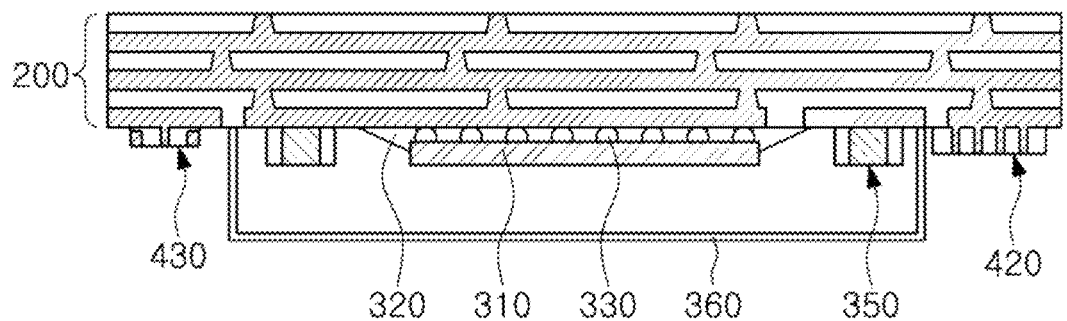

FIGS. 6A and 6B are side views illustrating examples of a lower structure of a connection member included in an antenna apparatus in the present disclosure.

Referring to FIG. 6A, an antenna apparatus in the present disclosure may include at least some of a connection member 200, an IC 310, an adhesive member 320, electrical connection structures 330, an encapsulant 340, passive components 350, and a sub-board 410.

The connection member 200 may have a structure similar to that of each of the connection members described above with reference to FIGS. 1 through 5B.

The IC 310 may be the same as the IC described above, and may be disposed below the connection member 200. The IC 310 may be electrically connected to a wiring of the connection member 200 to transfer an RF signal to the wiring or receive an RF signal transferred from the wiring, and may be electrically connected to a ground layer of the connection member 200 to receive a ground provided from the ground layer. For example, the IC 310 may perform at least some of frequency conversion, amplification, filtering, phase control, and power generation to generate a converted signal.

The adhesive member 320 may adhere the IC 310 and the connection member 200 to each other.

The electrical connection structures 330 may electrically connect the IC 310 and the connection member 200 to each other. For example, the electrical connection structures 330 may include any one or any combination of any two or more of a solder ball, a pin, a land, or a pad. The electrical connection structures 330 may have a melting point lower than those of the wiring and the ground layer of the connection member 200 to electrically connect the IC 310 and the connection member 200 to each other by a predetermined process using the low melting point.

The encapsulant 340 may encapsulate at least portions of the IC 310, and may improve heat dissipation performance and impact protection performance of the IC 310. For example, the encapsulant 340 may be implemented by a photoimagable encapsulant (PIE), an Ajinomoto build-up film (ABF), an epoxy molding compound (EMC), or the like.

The passive components 350 may be disposed on a lower surface of the connection member 200, and may be electrically connected to the wiring and/or the ground layer of the connection member 200 through the electrical connection structures 330. For example, the passive components 350 may include at least some of a capacitor (for example, a multilayer ceramic capacitor (MLCC)), an inductor, and a chip resistor.

The sub-board 410 may be disposed below the connection member 200, and may be electrically connected to the connection member 200 so as to receive an intermediate frequency (IF) signal or a base band signal transferred from an external apparatus and transfer the IF signal or the base band signal to the IC 310 or receive an IF signal or a base band signal transferred from the IC 310 and transfer the IF signal or the base band signal to the external apparatus. Here, a frequency (for example, 24 GHz, 28 GHz, 36 GHz, 39 GHz, 60 GHz, or the like) of the RF signal may be greater than that (for example, 2 GHz, 5 GHz, 10 GHz, or the like) of the IF signal.

For example, the sub-board 410 may transfer the IF signal or the base band signal to the IC 310 or receive the IF signal or the base band signal transferred from the IC 310, through a wiring that may be included in the IC ground layer of the connection member 200. Since a first ground layer of the connection member 200 is disposed between the IC ground layer and the wiring, the IF signal or the base band signal and the RF signal may be electrically isolated from each other within the antenna apparatus.

Referring to FIG. 6B, the antenna apparatus in the present disclosure may include at least some of a shielding member 360, a connector 420, and a chip antenna 430.

The shielding member 360 may be disposed below the connection member 200 and be disposed to shield the IC 310 together with the connection member 200. For example, the shielding member 360 may be disposed to cover (for example, conformal-shield) the IC 310 and the passive components 350 together or cover (for example, compartment-shield) the IC 310 and the passive components 350, respectively. For example, the shielding member 360 may have a hexahedron shape of which one surface is opened, and may be coupled to the connection member 200 to have a hexahedral accommodation space. The shielding member 360 may be formed of a material having high conductivity, such as copper, to have a short skin depth, and may be electrically connected to the ground layer of the connection member 200. Therefore, the shielding member 360 may reduce electromagnetic noise that may be applied to the IC 310 and the passive components 350.

The connector 420 may have a connection structure of a cable (for example, a coaxial cable, a flexible printed circuit board (PCB), may be electrically connected to the IC ground layer of the connection member 200, and may play a role similar to that of the sub-board described above. That is, the connector 420 may receive an IF signal, a base band signal, and/or power provided from the cable, or may provide an IF signal and/or a base band signal to the cable.

The chip antenna 430 may assist the antenna apparatus in the present disclosure to transmit or receive the RF signal. For example, the chip antenna 430 may include a dielectric block having a dielectric constant greater than that of an insulating layer and electrodes disposed on opposite surfaces of the dielectric block. One of the electrodes may be electrically connected to the wiring of the connection member 200, and the other of the electrodes may be electrically connected to the ground layer of the connection member 200.

Figure 7:
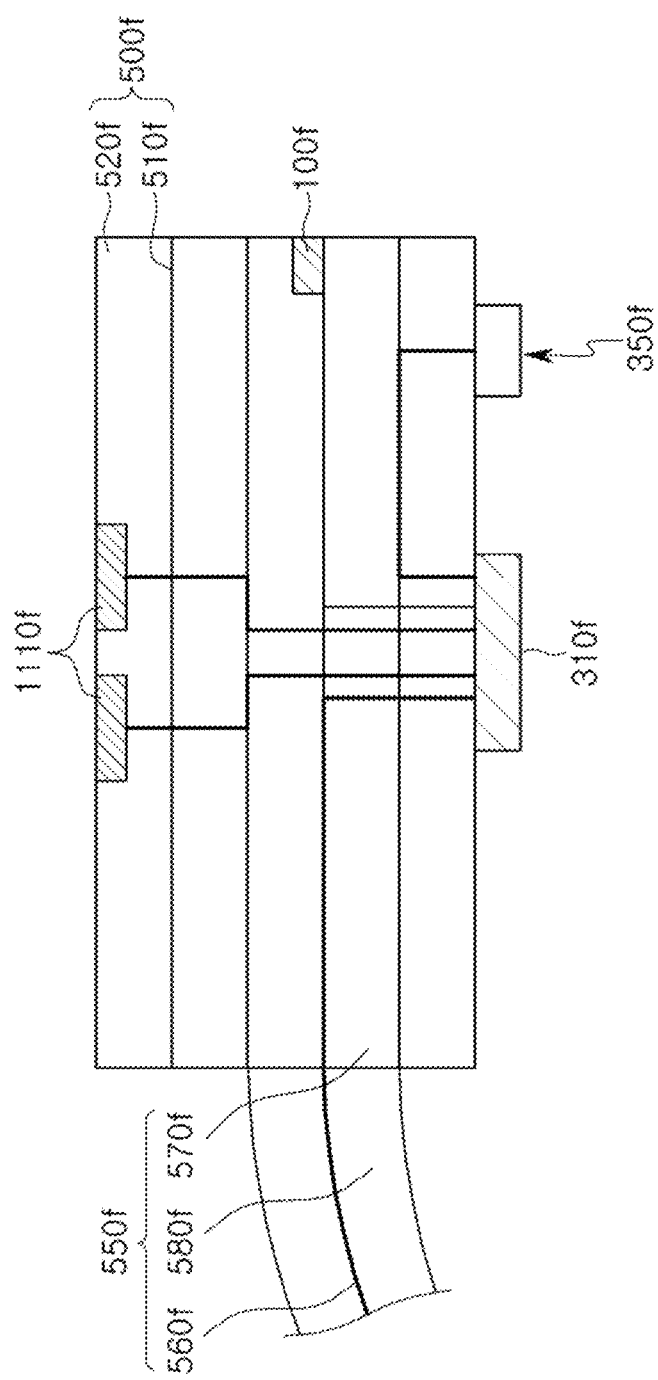
FIG. 7 is a side view illustrating an example of a structure of an antenna apparatus.

FIG. 7 is a side view illustrating an example of a structure of an antenna apparatus in the present disclosure.

Referring to FIG. 7, an antenna apparatus in the present disclosure may have a structure in which an end-fire antenna 100f, patch antenna patterns 1110f, an IC 310f, and a passive component 350f are integrated into a connection member 500f.

The end-fire antenna 100f and the patch antenna patterns 1110f may be designed to be the same as the antenna apparatus and the patch antenna pattern described above, respectively, and may receive RF signals transferred from the IC 310f and transmit the RF signals or transfer received RF signals to the IC 310f.

The connection member 500f may have a structure (for example, a structure of a printed circuit board) in which at least one conductive layer 510f and at least one insulating layer 520f are stacked. The conductive layer 510f may have the ground layer and the feed lines described above.

In addition, the antenna apparatus in the present disclosure may further include a flexible connection member 550f. The flexible connection member 550f may include a first flexible region 570f that overlaps the connection member 500f when viewed in the vertical direction and a second flexible region 580f that does not overlap the connection member 500f.

The second flexible region 580f may be flexibly bent in the vertical direction. Therefore, the second flexible region 580f may be flexibly connected to a connector of a set board and/or an adjacent antenna apparatus.

The flexible connection member 550f may include a signal line 560f. An intermediate frequency (IF) signal and/or a base band signal may be transferred to the IC 310f through the signal line 560f or be transferred to the connector of the set board and/or the adjacent antenna apparatus.

Figure 8A:
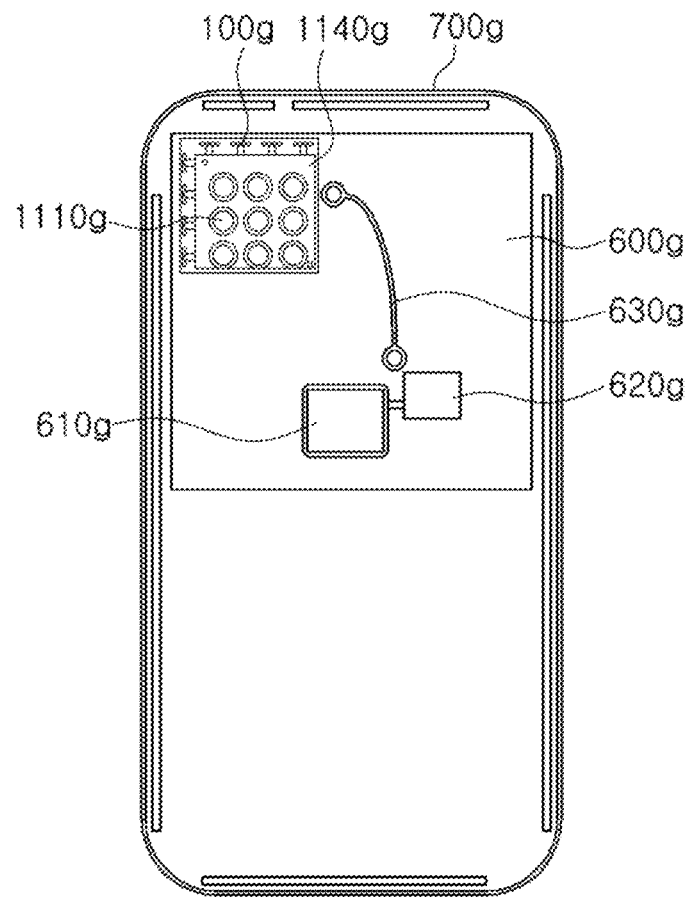
FIGS. 8A and 8B are plan views illustrating examples of a layout of an antenna apparatus in an electronic device.
Figure 8B:
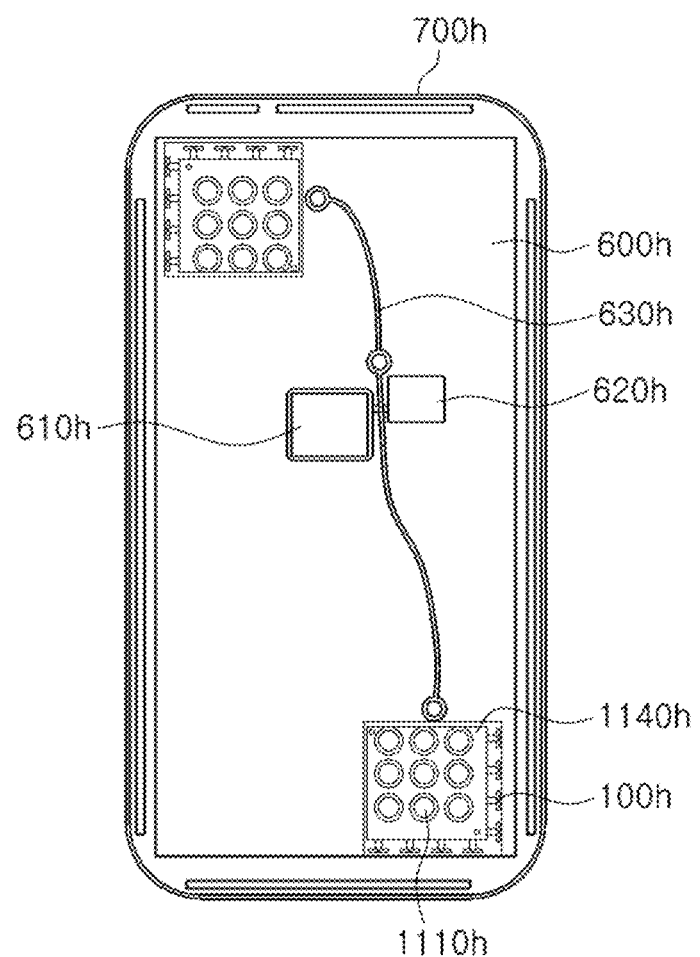

FIGS. 8A and 8B are plan views illustrating examples of a layout of an antenna apparatus in the present disclosure in an electronic device.

Referring to FIG. 8A, an antenna apparatus including end-fire antennas 100g, patch antenna patterns 1110g, and an insulating layer 1140g may be disposed adjacent to a side boundary of an electronic device 700g on a set board 600g of the electronic device 700g.

The electronic device 700g may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like, but is not limited thereto.

A communications module 610g and a base band circuit 620g may further be disposed on the set board 600g. The antenna apparatus may be electrically connected to the communications module 610g and/or the base band circuit 620g through a coaxial cable 630g.

The communications module 610g may include at least some of a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphic processing unit (GPU)), a digital signal processor, a cryptographic processor, a microprocessor, a microcontroller, or the like; and a logic chip such as an analog-digital converter, an application-specific IC (ASIC), or the like, so as to perform digital signal processing.

The base band circuit 620g may perform analog-digital conversion, amplification for an analog signal, filtering, and frequency conversion to generate a base signal. The base signal input or output from the base band circuit 620g may be transferred to the antenna apparatus through the cable.

For example, the base signal may be transferred to the IC through electrical connection structures, core vias, and wirings. The IC may convert the base signal into an RF signal in a millimeter wave band.

Referring to FIG. 8B, antenna apparatuses each including end-fire antennas 100h, patch antenna patterns 1110h, and an insulating layer 1140h may be disposed adjacent to opposing boundaries of an electronic device 700h, respectively, on a set board 600h of the electronic device 700h, and a communications module 610h and a base band circuit 620h may further be disposed on the set board 600h. The antenna apparatuses may be electrically connected to the communications module 610h and/or the base band circuit 620h through a coaxial cable 630h.

The patch antenna patterns, the coupling patch patterns, the ring-type meta patterns, the coupling-type meta patterns, the feed vias, the array vias, the grounding vias, the shielding vias, the wiring vias, the feed lines, the ground layer, the end-fire antenna patterns, the director patterns, the coupling ground patterns, and the electrical connection structures stated in the present specification may include a metal (for example, a conductive material such as copper (Cu), aluminum (Al), silver (Ag), tin (Sn), gold (Au), nickel (Ni), lead (Pb), titanium (Ti), or alloys thereof), and may be formed by a plating method such as chemical vapor deposition (CVD), physical vapor deposition (PVD), sputtering, a subtractive process, an additive process, a semi-additive process (SAP), a modified semi-additive process (MSAP), or the like, but are not limited thereto.

The insulating layer stated in the present specification may be implemented by FR4, a liquid crystal polymer (LCP), a low temperature co-fired ceramic (LTCC), a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), prepreg, an Ajinomoto build-up film (ABF), FR-4, Bismaleimide Triazine (BT), a photoimagable dielectric (PID) resin, a general copper clad laminate (CCL), a glass or ceramic based insulating material, or the like. The insulating layer may be filled in at least portions of positions in which the patch antenna patterns, the coupling patch patterns, the ring-type meta patterns, the coupling-type meta patterns, the feed vias, the array vias, the grounding vias, the shielding vias, the wiring vias, the feed lines, the ground layer, the end-fire antenna patterns, the director patterns, the coupling ground patterns, and the electrical connection structures are not disposed in the antenna apparatus stated in the present specification.

The RF signals stated in the present specification may have formats according to protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols, but are not limited thereto.

As set forth above, the antenna apparatus in the present disclosure may have a more efficient and improved antenna performance due in-part to the RF signals being further concentrated in the z-direction.

In addition, the antenna apparatus in the present disclosure may have a structure that improves antenna performance and is advantageous for miniaturization since performance may be improved relative to the sizes of components (for example, meta patterns) for concentrating the RF signals in the z-direction.

Further, the antenna apparatus in the present disclosure may have a more compressed structure, and may have an improved antenna performance relative to its size since electromagnetic interference generated in an adjacent antenna apparatus due to V pole RF signals of the patch antenna patterns may be reduced.

Further, the antenna apparatus in the present disclosure may have a more finely adjusted antenna performance since parameters (for example, cavities) dependent on antenna performance may be additionally provided.

Further, in the antenna apparatus in the present disclosure, since a structure in which impedances of the components (for example, the meta patterns) for concentrating the RF signals in the z-direction are balanced may be provided, meta pattern coupling efficiency of antenna apparatuses may be improved, and the antenna apparatus may have more improved antenna performance.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna apparatus, comprising:
   first and second patch antenna patterns;
   second-type meta patterns arranged in a region between the first and second patch antenna patterns; and
   first-type meta patterns arranged in a first region between the first patch antenna pattern and the second-type meta patterns and a second region between the second patch antenna pattern and the second-type meta patterns,
   wherein a direction between centers of adjacent ones of the first-type meta patterns is oblique to a direction between centers of adjacent ones of the second-type meta patterns.

2. The antenna apparatus of claim 1, wherein the first-type meta patterns are overlappingly arranged with each other in a vertical direction, and
   wherein the second-type meta patterns are overlappingly arranged with each other in a vertical direction.

3. The antenna apparatus of claim 2, further comprising array vias connecting the first-type meta patterns to each other in the vertical direction.

4. The antenna apparatus of claim 3, wherein the second-type meta patterns overlappingly arranged with each other in a vertical direction have a shape of at least one of capacitors.

5. The antenna apparatus of claim 1, wherein the first-type meta patterns are arranged in N bent rows, wherein N is a natural number, and
wherein one of the first-type meta patterns disposed on one of bent points of the N bent rows has a 'L' shape.

6. The antenna apparatus of claim 5, wherein one of the second-type meta patterns adjacent to the one of the first-type meta patterns having the 'L' shape has a rectangular shape.

7. The antenna apparatus of claim 1, wherein the second-type meta patterns are arranged in N zigzag rows, wherein N is a natural number, and the first-type meta patterns serially arranged.

8. The antenna apparatus of claim 1, wherein the second-type meta patterns have a form in which portions of second-type meta patterns closer to the first patch antenna pattern and portions of second-type meta patterns closer to the second patch antenna pattern are alternately inserted with respect to each other.

9. The antenna apparatus of claim 1, wherein the first-type meta patterns are arranged to have spaces therebetween, the spaces having a first gap, and
one side of sides of the second-type meta patterns are disposed to be spaced apart from the first-type meta patterns by the first gap, and
another side of other sides of the second-type meta patterns are disposed to be spaced apart from the first-type meta patterns by a second gap greater than the first gap.

10. The antenna apparatus of claim 1, wherein the first-type meta patterns are arranged to have spaces therebetween, the spaces having a first gap, and
wherein the second-type meta patterns are arranged to form cavities each having a width wider than the spaces between the first-type meta patterns.

11. The antenna apparatus of claim 10, wherein each of the cavities has an area smaller than an area of each of the second-type meta patterns.

12. The antenna apparatus of claim 10, wherein the second-type meta patterns are arranged to have spaces therebetween, the spaces having substantially the same gap as the first gap.

13. The antenna apparatus of claim 10, wherein the cavity has a polygonal shape in which a length in a first direction and a length in a second direction perpendicular to the first direction are different from each other.

14. The antenna apparatus of claim 13, wherein each of the second-type meta patterns has a polygonal shape in which a length in the first direction is greater than a length in the second direction, and
the cavity has a polygonal shape in which the length in the second direction is greater than the length in the first direction.

15. The antenna apparatus of claim 1, further comprising a ground layer disposed below the first and second patch antenna patterns and having through-holes; and
feed vias respectively disposed below the first and second patch antenna patterns and to penetrate through the through-holes.

16. An antenna apparatus, comprising:
a patch antenna pattern;
an end-fire antenna pattern having a shape different from a shape of the patch antenna pattern;
second-type meta patterns arranged in a region between the patch antenna pattern and the end-fire antenna pattern; and
first-type meta patterns arranged in a region between the patch antenna pattern and the second-type meta patterns,
wherein the first-type meta patterns are arranged to have spaces therebetween, the spaces having a first gap, and
wherein the second-type meta patterns are arranged to form cavities each having a width wider than the spaces between the first-type meta patterns.

17. The antenna apparatus of claim 16, wherein the first-type meta patterns are overlappingly arranged with each other in a vertical direction, and
wherein the second-type meta patterns are overlappingly arranged with each other in a vertical direction.

18. The antenna apparatus of claim 17, further comprising array vias connecting the first-type meta patterns to each other in the vertical direction.

19. The antenna apparatus of claim 18, wherein the second-type meta patterns overlappingly arranged with each other in a vertical direction have a shape of at least one of capacitors.

20. The antenna apparatus of claim 16, wherein the end-fire antenna pattern is configured to form a radiation pattern in a direction different from a direction of a radiation pattern of the patch antenna pattern.

\* \* \* \* \*